(12) United States Patent
Yamazaki et al.

(10) Patent No.: US 7,564,054 B2
(45) Date of Patent: Jul. 21, 2009

(54) THIN FILM FORMING DEVICE, METHOD OF FORMING A THIN FILM, AND SELF-LIGHT-EMITTING DEVICE

(75) Inventors: Shunpei Yamazaki, Tokyo (JP); Masaaki Hiroki, Kanagawa (JP); Noriko Ishimaru, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 141 days.

(21) Appl. No.: 11/366,058

(22) Filed: Mar. 2, 2006

(65) Prior Publication Data

US 2006/0197080 A1 Sep. 7, 2006

Related U.S. Application Data

(60) Continuation of application No. 10/790,972, filed on Mar. 2, 2004, which is a division of application No. 09/798,608, filed on Mar. 2, 2001, now Pat. No. 6,699,739.

(30) Foreign Application Priority Data

| | | |
|---|---|---|
| Mar. 6, 2000 | (JP) | ............................. 2000-061274 |
| Mar. 27, 2000 | (JP) | ............................. 2000-087696 |

(51) Int. Cl.
*H01L 29/08* (2006.01)
(52) U.S. Cl. .................... 257/40; 257/88; 257/E51.022
(58) Field of Classification Search .................. 257/40, 257/88, E51.022
See application file for complete search history.

(56) References Cited

U.S. PATENT DOCUMENTS

| | | | |
|---|---|---|---|
| 3,060,429 A | 10/1962 | Winston | ........................ 346/1 |
| 3,147,142 A | 9/1964 | Rudo | ......................... 118/301 |
| 3,416,153 A | 12/1968 | Hertz et al. | .................... 346/75 |
| 3,527,652 A | 9/1970 | Ozaki et al. | ................. 117/33.5 |
| 3,596,275 A | 7/1971 | Sweet | ............................ 346/1 |
| 3,747,120 A | 7/1973 | Stemme | ....................... 346/75 |
| 3,946,398 A | 3/1976 | Kyser et al. | .................... 346/1 |
| 4,226,182 A | 10/1980 | Danielsen et al. | ........... 101/129 |
| 4,601,922 A | 7/1986 | Moroboshi et al. | ....... 427/248.1 |

(Continued)

FOREIGN PATENT DOCUMENTS

CN 1237258 A 12/1999

(Continued)

OTHER PUBLICATIONS

Tsutsui, T. et al, "Electroluminescence in Organic Thin Films," Photochemical Processes in Organized Molecular Systems, pp. 437-450, (1991).

(Continued)

*Primary Examiner*—Asok K Sarkar
(74) *Attorney, Agent, or Firm*—Cook Alex Ltd.

(57) ABSTRACT

Measure of forming an EL layer by selectively depositing through evaporation a material for forming the EL layer at a desired location is provided. When a material for forming an EL layer is deposited, a mask (113) is provided between a sample boat (111) and a substrate (110). By applying voltage to the mask (113), the direction of progress of the material for forming the EL layer is controlled to be selectively deposited at a desired location.

43 Claims, 17 Drawing Sheets

U.S. PATENT DOCUMENTS

| | | | |
|---|---|---|---|
| 4,620,196 A | 10/1986 | Hertz et al. ............... 346/1.1 |
| 5,247,190 A | 9/1993 | Friend et al. ............... 257/40 |
| 5,264,376 A | 11/1993 | Abbott et al. ............... 437/5 |
| 5,332,648 A * | 7/1994 | Kihara et al. ............ 430/270.1 |
| 5,344,676 A | 9/1994 | Kim et al. ............... 427/468 |
| 5,399,502 A | 3/1995 | Friend et al. ............... 437/1 |
| 5,427,858 A | 6/1995 | Nakamura et al. ......... 428/421 |
| 5,583,552 A | 12/1996 | Mutoh ......................... 347/80 |
| 5,681,675 A | 10/1997 | Kurauchi et al. |
| 5,688,551 A | 11/1997 | Littman et al. ............... 427/64 |
| 5,811,020 A | 9/1998 | Alwan ......................... 216/42 |
| 5,827,628 A | 10/1998 | Shin et al. ..................... 430/28 |
| 5,904,781 A | 5/1999 | Goodman et al. ........... 118/726 |
| 5,916,729 A | 6/1999 | Kobayashi et al. ....... 430/270.1 |
| 5,952,037 A | 9/1999 | Nagayama et al. ........... 427/66 |
| 6,043,857 A | 3/2000 | Kurauchi et al. |
| 6,120,943 A | 9/2000 | Kurauchi et al. |
| 6,194,837 B1 | 2/2001 | Ozawa |
| 6,255,775 B1 | 7/2001 | Ikuko et al. |
| 6,300,021 B1 | 10/2001 | Gorog et al. ................ 430/23 |
| 6,348,359 B1 | 2/2002 | Van Slyke et al. ............ 438/29 |
| 6,373,187 B1 * | 4/2002 | Nagayama et al. .......... 313/506 |
| 6,403,392 B1 | 6/2002 | Burrows et al. ............... 438/22 |
| 6,420,834 B2 | 7/2002 | Yamazaki et al. ........ 315/169.3 |
| 6,445,128 B1 | 9/2002 | Bush et al. ................... 313/509 |
| 6,448,718 B1 | 9/2002 | Battersby ................. 315/169.3 |
| 6,514,649 B1 | 2/2003 | Sakaguchi ................... 430/47 |
| 6,541,918 B1 * | 4/2003 | Yudasaka ................ 315/169.3 |
| 6,545,424 B2 | 4/2003 | Ozawa |
| 6,555,968 B2 | 4/2003 | Yamazaki et al. ........ 315/169.3 |
| 6,617,608 B2 | 9/2003 | Bae et al. ...................... 257/40 |
| 6,696,105 B2 | 2/2004 | Hiroki et al. ................ 427/466 |
| 6,699,739 B2 * | 3/2004 | Yamazaki et al. ........... 438/156 |
| 6,750,618 B2 | 6/2004 | Yamazaki et al. ........ 315/169.3 |
| 6,794,816 B2 | 9/2004 | Sakaguchi ................... 313/507 |
| 6,852,355 B2 | 2/2005 | Blanchet-Fincher ......... 427/58 |
| 7,022,535 B2 * | 4/2006 | Yamazaki et al. ............. 438/29 |
| 2001/0017409 A1 | 8/2001 | Hiroki et al. ................ 257/723 |
| 2002/0031874 A1 | 3/2002 | Yamazaki et al. ........... 438/156 |
| 2003/0132703 A1 | 7/2003 | Sakaguchi ................... 313/504 |
| 2004/0074584 A1 | 4/2004 | Kishimoto ................... 156/67 |
| 2005/0110716 A1 | 5/2005 | Eida ............................. 345/76 |

FOREIGN PATENT DOCUMENTS

| | | |
|---|---|---|
| EP | 0 250 102 A2 | 12/1987 |
| EP | 0 880 303 | 11/1998 |
| EP | 0 892 028 | 1/1999 |
| EP | 0 932 137 A1 | 7/1999 |
| EP | 1 505 649 A2 | 2/2005 |
| JP | 60-67661 | 4/1985 |
| JP | 60-67662 | 4/1985 |
| JP | 60-67663 | 4/1985 |
| JP | 09-209127 | 8/1997 |
| JP | 10-012377 | 1/1998 |
| JP | 10-092576 | 4/1998 |
| JP | 10-153967 | 6/1998 |
| JP | 10-261490 | 9/1998 |
| JP | 10-319870 | 12/1998 |
| JP | 11-040358 | 2/1999 |
| JP | 11-054270 | 2/1999 |
| JP | 11-054272 | 2/1999 |
| JP | 11-271753 | 10/1999 |
| JP | 2000-113979 | 4/2000 |
| KR | 171230 | 10/1998 |
| KR | 99-57107 | 7/1999 |
| WO | WO 90/13148 | 11/1990 |

OTHER PUBLICATIONS

Baldo, M.A. et al, "Highly Efficient Phosphorescent Emission from Organic Electroluminescent Devices," Nature, vol. 395, pp. 151-154, Sep. 10, 1998.

Baldo, M.A. et al, "Very High-Efficiency Green Organic Light-Emitting Devices Based on Electrophosphorescence," Applied Physics Letters, vol. 75, No. 1, pp. 4-6, Jul. 5, 1999.

Tsutsui, T. et al, "High Quantum Efficiency in Organic Light-Emitting Devices with Iridium-Complex as a Triplet Emissive Center," Japanese Journal of Applied Physics, vol. 38, part 2, No. 12B, pp. L1502-L1504, Dec. 15, 1999.

Schenk, H. et al, "Polymers for Light Emitting Diodes," Eurodisplay '99, Proceedings of the 19th International Display Research Conference, Berlin, Germany, Sep. 6-9, 1999, pp. 33-37 (1999).

Sweet, R.G., "High Frequency Recording with Electrostatically Deflected Ink Jets," The Review of Scientic Instruments, vol. 36, No. 2, pp. 131-136, Feb. 1965.

Pimbley, W.T. et al, "Satellite Droplet Formation in a Liquid Jet," IBM J. Res. Develop., vol. 21, No. 1, pp. 21-30, Jan. 1977.

Hertz, C.H. et al, "Ink Jet Printing of High Quality Color Images," Journal of Imaging Technology, vol. 15, No. 3, pp. 141-148, Jun. 1989.

Kimura, M. et al, "Low-Temperature Poly-Si TFT Driven Light Emitting Polymer Displays and Digital Gray Scale for Uniformity," IDW '99, pp. 171-174, (1999).

Hunter, I.M. et al, "Design of an Active Matrix Polymer-LED Display with Reduced Horizontal Cross-Talk," IDW '99, pp. 1095-1096, (1999).

Shimoda, T. et al, "Technology for Active Matrix Light Emitting Polymer Displays," IDEM 99, pp. 107-110, (1999).

Lee, J.D. et al, "Two-Dimensional Nozzle Arrangement in a Monolithic Inkjet Printhead for High-Resolution and High-Speed Printing," IDEM 99, pp. 127-130, (1999).

Burrows, P.E. et al, "Color-Tunable Pixels and Lasers Using Vacuum-Deposited Organic Thin Films," Proceedings of the SPIE, (Bellingham, VA) vol. 3148, pp. 252-263, Jul. 1997.

European Patent Office search report re application No. EP 01104265.2, dated May 6, 2005.

Usui, H., et al., "Ionization-assisted deposition of $Alq_3$ films", Thin Solid Films, vol. 288, No. 1, pp. 229-234, 1996.

Office Action from the Korean Intellectual Property Office; Application No. 10-2001-0011102, dated Apr. 9, 2007.

Office Action from the Korean Intellectual Property Office; Application No. 10-2006-0020444, dated Apr. 9, 2007.

Office Action from the Korean Intellectual Property Office; Application No. 10-2006-0020445, dated Apr. 9, 2007.

Office Action re European patent application No. EP 01104265.2, dated Oct. 17, 2007.

Chinese Office Action re application No. CN 200510098190.6, dated Jun. 27, 2008 (with English translation).

* cited by examiner

Chemical Formula 1
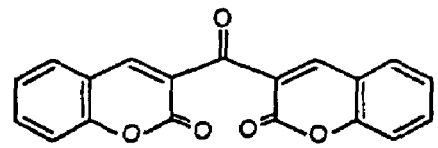
Chemical Formula 2
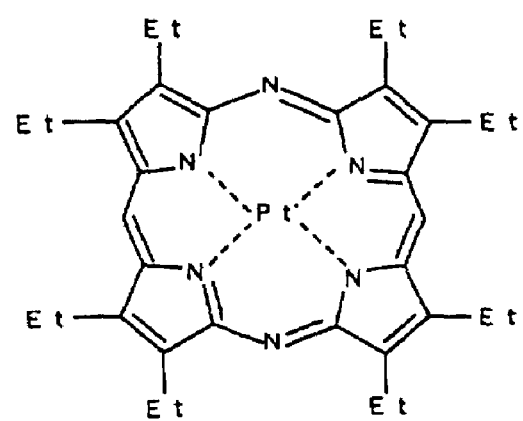
Chemical Formula 3
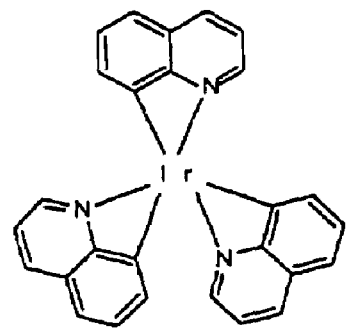
FIG. 1

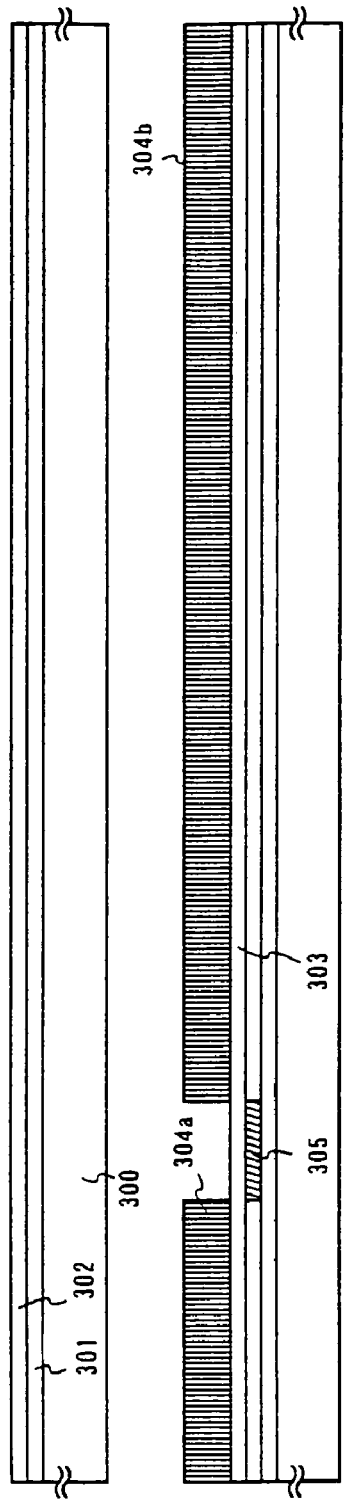

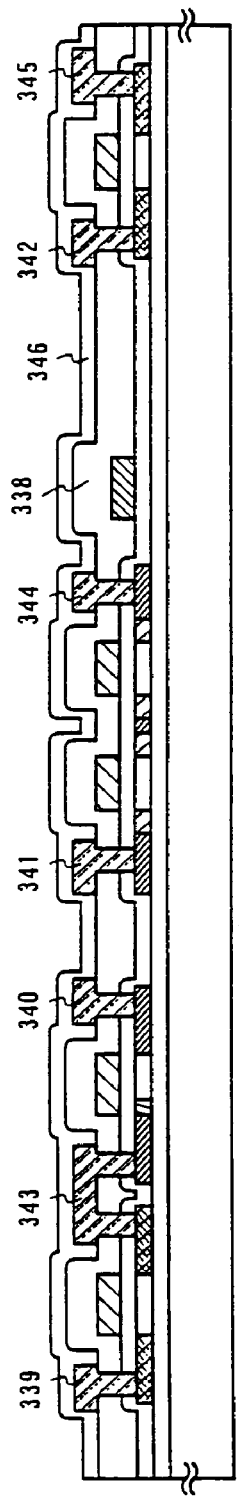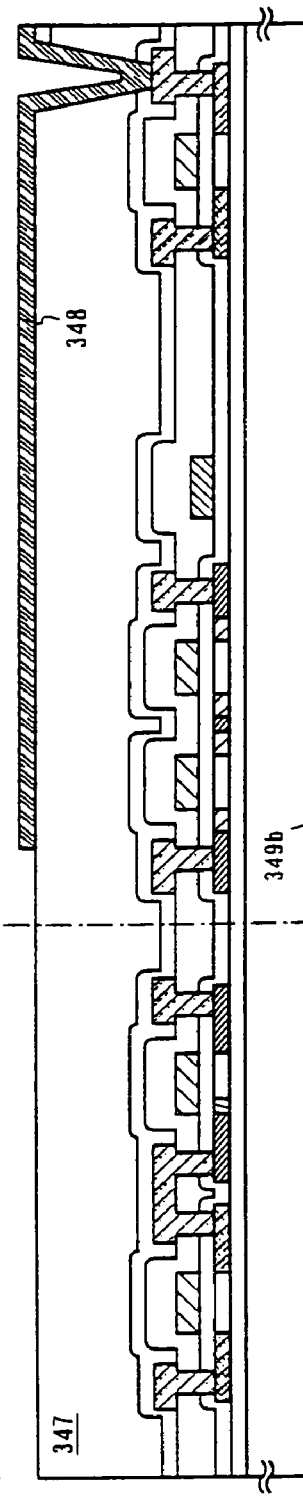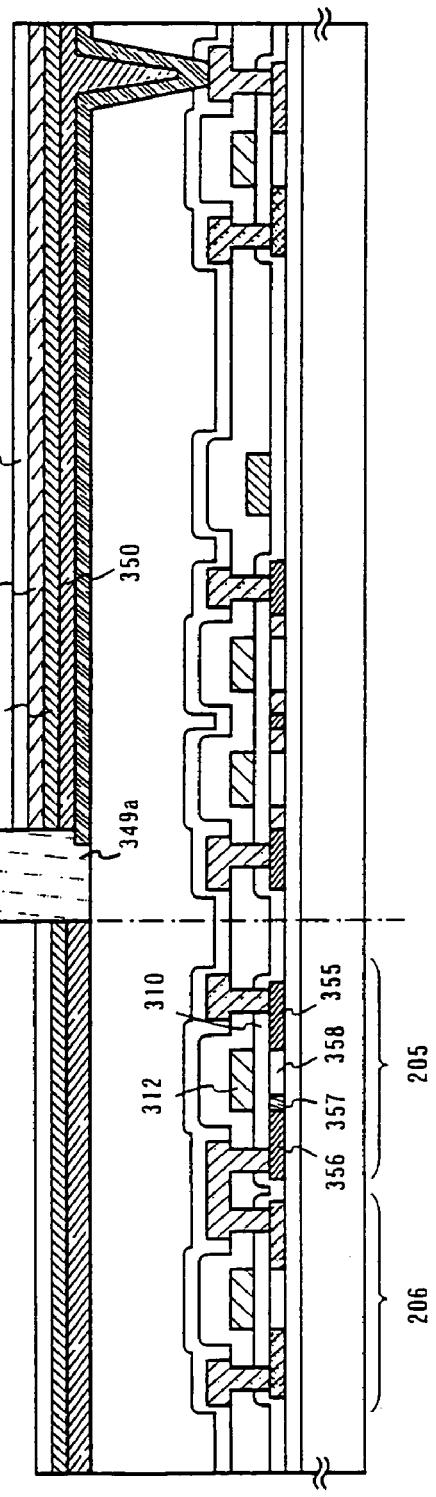
Fig.6A
Fig.6B
Fig.6C

Enlarged View of 1017

THIN FILM FORMING DEVICE, METHOD OF FORMING A THIN FILM, AND SELF-LIGHT-EMITTING DEVICE

This application is a continuation of U.S. application Ser. No. 10/790,972, filed on Mar. 2, 2004 which is a divisional of U.S. application Ser. No. 09/798,608 filed Mar. 2, 2001 (now U.S. Pat. No. 6,699,739 issued Mar. 2, 2004).

BACKGROUND OF THE INVENTION

1. Field of the Invention

The present invention relates to a self-light-emitting device having an EL element formed on an insulator and structured to have an anode, a cathode, and a light-emitting organic material that provides electro luminescence (hereinafter referred to as an organic EL material) sandwiched therebetween, an electric apparatus having such a self-light-emitting device as a display unit (a display or a monitor), and a method of manufacturing thereof. It is to be noted that such an EL display device is sometimes referred to as an OLED (organic light emitting diode).

2. Description of the Related Art

These days, display devices using EL elements as self-light-emitting devices utilizing electro luminescence of a light-emitting organic material (EL display devices) are actively developed. Since an EL display device is of a self-light-emitting type, unlike the case of a liquid crystal display device, no backlight is necessary. Further, since the view angle is wide, an EL display device is expected to be promising as a display unit of an electric apparatus.

EL display devices are broken down into two: a passive type (simple matrix type); and an active type (active matrix type), both of which have been actively developed. Particularly, active matrix EL display devices are attracting attention these days. With regard to EL materials to be an EL layer which can be the to be the center of an EL element, low molecular weight organic EL materials and macromolecular (polymer) organic EL materials have been studied.

A film of an EL material is formed by ink jetting, evaporation, spin coating, or the like. With regard to evaporation, the location of film formation is controlled using a mask. Here, there is a problem in that the EL material does not pass through the mask, but instead is deposited on the mask.

SUMMARY OF THE INVENTION

The present invention has been made in view of the above, and an object of the present invention is therefore to provide means for selectively forming a film of an EL material without a waste by evaporation where the EL material is controlled by an electric field using a mask. Another object of the present invention is to improve the accuracy of controlling the location of film formation. Still another object of the present invention is to provide a self-light-emitting device using such measures and a method of manufacturing thereof. Yet another object of the present invention is to provide an electric apparatus having such a self-light-emitting device as a display unit.

In order to attain the above objects, according to the present invention, voltage is applied to the mask and a pixel electrode on which film formation is to be performed.

According to the present invention, the EL material is provided in a sample boat. By vaporizing and charging the EL material, it is discharged from an opening of the sample boat due to the vaporization, and, before it reaches a substrate, its direction of progress is controlled by the electric field generated by voltage applied to the mask, and thus, the location of deposition of the EL material can be controlled.

A plurality of masks may be used. For instance, an electric field is generated by voltages applied to a first mask and a second mask respectively, thereby controlling the direction of progress of the EL material and controlling the location where it is deposited.

BRIEF DESCRIPTION OF THE DRAWINGS

In the accompanying drawings:

FIGS. 1A and 1B are diagrams showing a method of depositing by evaporation an organic EL material according to the present invention;

FIGS. 4A to 4E are diagrams illustrating a process of manufacturing an EL display device;

FIGS. 6A to 6C are diagrams illustrating the process of manufacturing an EL display device;

DETAILED DESCRIPTION OF THE PREFERRED EMBODIMENTS

Figure 2:
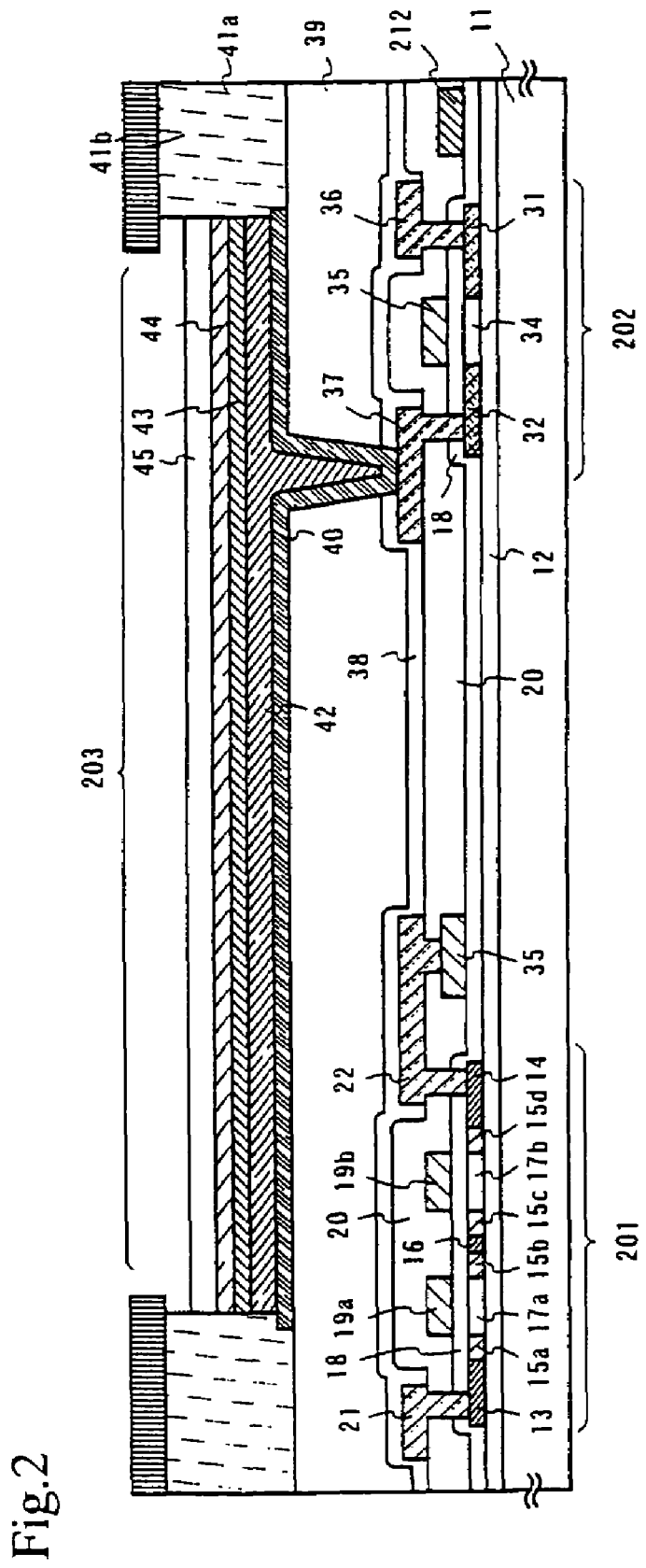
FIG. 2 is a diagram illustrating the structure in section of a pixel portion.

An embodiment mode of the present invention is now described with reference to FIGS. 1A and 1B.

FIG. 1A schematically illustrates how a film of an EL material is formed in accordance with the present invention. In FIG. 1A, a pixel electrode on a substrate 110 is connected to a ground potential. A sample boat 111 has an EL material contained therein.

It is to be noted that, when a red EL layer is formed, the sample boat 111 contains an EL material that emits red light (hereinafter referred to as a red EL material). When a green EL layer is formed, the sample boat 111 contains an EL material that emits green light (hereinafter referred to as a green EL material). When a blue EL layer is formed, the sample boat 111 contains an EL material that emits blue light (hereinafter referred to as a blue EL material).

According to the present invention, the EL material in the sample boat 111 is vaporized and discharged by resistance heating due to an electrode 120. The EL material becomes, when discharged, negatively charged particles due to negative voltage applied to an electrode 112. The negatively charged particles pass through gaps of a mask 113 formed of a conductive material, and are deposited on the pixel electrode on the substrate 110. An insulator is provided between the electrodes 112 and 120, to which different voltages are applied.

It is to be noted that, as illustrated in FIG. 1B that is an enlarged view of 117, the direction of progress of the EL material is controlled by blocking portions 118 of the mask 113 when the EL material passes through the mask 113. In the mask 113, the blocking portions 118 are a plurality of conductive wires arranged in parallel with one another (stripe-like) formed of a conductive material such as copper, iron, aluminum, tantalum, titanium, or tungsten, a mesh-like structure, or a plate-like structure. The EL material in a vapor state repels an electric field generated by negative voltage applied to the blocking portions 118, and thus, passes through the gaps between the blocking portions 118 to be deposited on the substrate.

Though illustrated in FIGS. 1A and 1B is a case where the section of a blocking portion 118 is circular, the present invention is not limited thereto, and the section may be rectangular, oval or polygonal.

It is to be noted that voltage for giving the EL material in a vapor state a potential that causes the EL material to repel the blocking portions 118 of the mask 113 is applied to the blocking portions 118 of the mask 113. This allows the EL material to pass through the gaps between the blocking portions 118 of the mask 113. It is to be noted that, here, the EL material in a vapor state is charged by the electric field generated by the electrode 112 to which negative voltage is applied, while negative voltage is applied by an electrode 115 to the blocking portions 118 of the mask 113 to generate an electric field. These make the charged particles of the EL material in a vapor state electrically repel the blocking portions to pass through gaps between the blocking portions.

By making a structure as illustrated in FIG. 1A and by appropriately controlling the negative voltage applied to the blocking portions 118 in the range of several equal to or more than 10 V and equal to or less than 10 kV, the location of deposition can be controlled with high accuracy.

It is to be noted that the distance between the mask 113 and the substrate, the distance between the blocking portions 118, and the like can be appropriately set by those who implement the present invention. For example, the distance between the blocking portions 118 may be a pixel pitch of the pixel electrode formed over the substrate.

Further, in order to accurately position the mask 113, the mask 113 may be formed by laminating two conductive plates and cutting them simultaneously by an electron discharge method to form slit-like or circular holes.

Further, though a case where one mask is used is described here, voltage may be applied to two or more masks to control the direction of trajectory of the EL material. Further, voltage may be applied to a combination of two or more masks in one plane to control the direction of trajectory of the EL material in a vapor state.

First, a red EL material is put in the sample boat 111 and is deposited by evaporation to form a stripe-like red EL layer on a pixel.

After the mask is moved in a direction of an arrow k by one pixel column, a green EL material is deposited by evaporation from the sample boat 111 to form a green EL layer. The mask is further moved in the direction of the arrow k by one pixel column, deposition by evaporation is made in a similar way, and a blue EL layer is formed.

In other words, by depositing in three installments pixel columns emitting red, green, and blue light, respectively, as the mask is moved in the direction of the arrow k, stripe-like EL layers of three colors are formed. It is to be noted that the thickness of the EL layers formed here is preferably 10 nm to 10 µm.

A pixel column as used herein refers to a column of pixels formed by being partitioned by banks 119. The banks 119 are formed over source wirings of the pixel columns so as to be banks filling gaps between the pixel columns. In other words, since the banks partition the pixel columns, EL layers can be formed in the respective pixel columns on pixels while distinguishing one pixel column from its adjacent pixel column. Therefore, a pixel column may also be represented as a plurality of pixels lined up along a source wiring. Though a case where the banks are formed over the source wirings is described here, the banks may be formed over gate wirings. In that case, a plurality of pixels lined up along a gate wiring is referred to as a pixel column.

Therefore, a pixel portion (not shown) on pixel electrodes may be regarded as an aggregate of a plurality of pixel columns partitioned by stripe-like banks provided over a plurality of source wirings or a plurality of gate wirings. The pixel portion on the pixel electrodes may also be regarded as constitution of pixel columns having stripe-like EL layers emitting red light formed thereon, pixel columns having stripe-like EL layers emitting green light formed thereon, and pixel columns having stripe-like EL layers emitting blue light formed thereon.

Since the stripe-like banks are provided over the plurality of source wirings or the plurality of gate wirings, practically, the pixel portion may also be regarded as an aggregate of a plurality of pixel columns partitioned by the plurality of source wirings or the plurality of gate wirings actually.

Further, in this embodiment mode, it is preferable to apply voltage to a pixel electrode (an anode) formed on the substrate 110 to generate an electric field that further controls the EL material in a vapor state having passed through the mask and selectively deposits the EL material in a vapor state at desired locations.

Further, by applying negative voltage by an electrode 114 to inner side surfaces of an evaporation chamber 121 which has therein the sample boat 111, the mask 113, and the substrate 110, the negatively charged EL material in a vapor state can be made to repel the inner side surfaces of the evaporation chamber, and, therefore, the EL material in a vapor state can be deposited without adhering to the inner side surfaces of the evaporation chamber.

Embodiment 1

In this embodiment, a method of controlling an EL material vaporized in a sample boat (hereinafter referred to as an EL material in a vapor state) using an electric field and forming the film on a substrate is described with reference to FIGS. 1A and 1B.

In FIGS. 1A and 1B, a reference numeral 110 denotes a substrate. A sample boat 111 has a material for an EL layer.

It is to be noted that, when a red EL layer is to be formed, the sample boat 111 contains an EL material that emits red light (hereinafter referred to as a red EL material). When a green EL layer is to be formed, the sample boat 111 contains an EL material that emits green light (hereinafter referred to as a green EL material). When a blue EL layer is to be formed, the sample boat 111 contains an EL material that emits blue light (hereinafter referred to as a blue EL material).

It is to be noted that, in this embodiment, Alq as a host material with a red fluorescent pigment DCM doped therein is used as the red EL material for forming a red EL layer, Alq that is a complex of aluminum and 8-hydroxyquinoline is used as the green EL material for forming a green-light-emitting EL layer, and a complex of zinc and benzoxazole $(Zn(oxz)_2)$ is used as the blue EL material for forming a blue-light-emitting EL layer.

It is to be noted that the above EL materials are merely examples and other conventional EL materials may also be used. Further, though the EL materials are selected to emit red, green, and blue light, the present invention is not limited thereto and colors such as yellow, orange, and gray may also be used.

In this embodiment, first, the sample boat contains the red EL material. After a red EL layer is formed on the substrate, the sample boat now containing the green EL material is used to form a green EL layer on the substrate. Then, finally, the sample boat now containing the blue EL material is used to form a blue EL layer on the substrate.

By depositing through evaporation of the red, green, and blue EL materials in three installments as described in the above, EL layers can be formed.

The EL material in each color is vaporized in the sample boat by resistance heating using an electrode 120. When the EL material is discharged from the sample boat 111, it is charged by the electric field generated by an electrode 112. Here, the EL material is discharged by higher kinetic energy obtained by the vaporization to reach a mask 113.

Since voltage is applied to the mask 113, an electric field is generated around the mask 113. The material in a vapor state for the EL layer having reached the mask 113 is, after being controlled by the electric field generated by the mask 113, passes through the mask 113 to be deposited on the substrate 110.

By depositing through evaporation of the red EL material in the sample boat 111, a stripe-like red EL layer is formed on pixels. Here, the mask is moved in a direction of an arrow k by one pixel column, and in a similar way, a green EL material is deposited through evaporation from the sample boat 111 to form a green EL layer next to the red EL layer. The mask is further moved in the direction of the arrow k by one pixel column and the blue EL material is deposited through evaporation from the sample boat 111 to form a blue EL layer next to the green EL layer. In other words, by depositing in three installments pixel columns emitting red, green, and blue light, respectively, as the mask is moved in the direction of the arrow k, stripe-like EL layers of three colors are formed. It is to be noted that the thickness of the EL layers formed here is preferably 100 nm to 1 μm.

It is to be noted that a pixel column as used herein refers to a column of pixels formed by being partitioned by banks 119 that are formed over source wirings. Therefore, a pixel column may also be represented as a plurality of pixels lined up along a source wiring. Though a case where the banks are formed over the source wirings is described here, the banks may be formed over gate wirings. In that case, a plurality of pixels lined up along a gate wiring is referred to as a pixel column.

Therefore, a pixel portion (not shown) may be regarded as an aggregate of a plurality of pixel columns partitioned by stripe-like banks provided over a plurality of source wirings or a plurality of gate wirings. The pixel portion may also be regarded as constitution of pixel columns having stripe-like EL layers emitting red light formed thereon, pixel columns having stripe-like EL layers emitting green light formed thereon, and pixel columns having stripe-like EL layers emitting blue light formed thereon.

Since the stripe-like banks are provided over the plurality of source wirings or the plurality of gate wirings, practically, the pixel portion may also be regarded as an aggregate of a plurality of pixel columns partitioned by the plurality of source wirings or the plurality of gate wirings actually.

Further, it is preferable to apply voltage to a pixel electrode (an anode) formed on the substrate 110 to generate an electric field that further controls the EL material in a vapor state having passed through the mask and selectively deposits the EL material in a vapor state at desired locations.

Embodiment 2

Figure 3A:
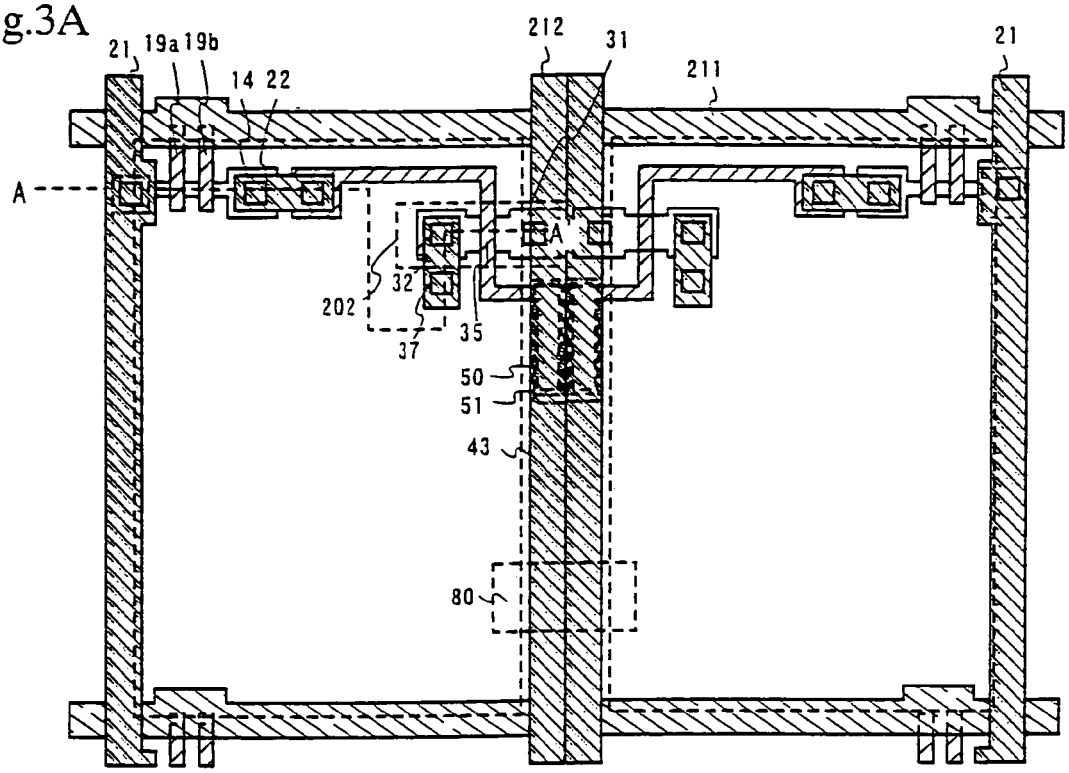
FIGS. 3A to 3C are diagrams illustrating the structure of the pixel portion and the top view thereof.
Figure 3B:
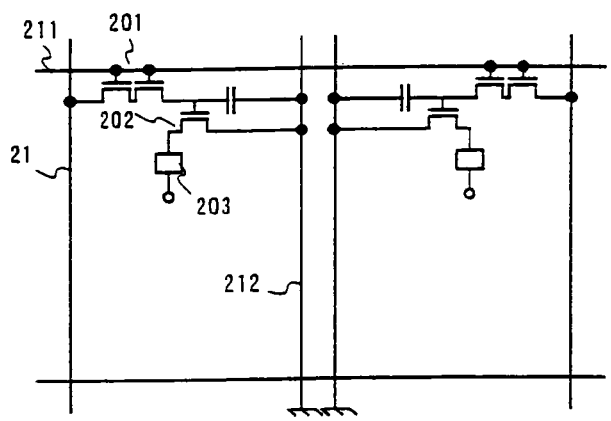

FIG. 2 is a sectional view of a pixel portion of an EL display device according to this embodiment. FIG. 3A is a top view of the pixel portion, and FIG. 3B illustrates its circuit structure. Actually, a plurality of pixels are arranged to be matrix-like to form a pixel portion (an image display portion). It is to be noted that FIG. 2 is a sectional view taken along the line A-A' in FIG. 3A. Thus, since common numeralss are used in FIG. 2 and FIGS. 3A, 3B, and 3C, reference may be suitably made to the both drawings. Two pixels are illustrated in the top view of FIG. 3A, and the two pixels are of the same structure.

In FIG. 2, reference numerals 11 and 12 denote a substrate and an insulating film to be a base (hereinafter referred to as a base film), respectively. As the substrate 11, glass, glass ceramics, quartz, silicon, ceramics, metal, or plastic can be used.

Especially when a substrate containing movable ions or a conductive substrate is used, it is effective to use the base film 12, while a quartz substrate may not be provided with the base film 12. As the base film 12, an insulating film containing silicon may be used. It is to be noted that the term "an insulating film containing silicon" herein refers to an insulating film containing a predetermined percentage of silicon, and oxygen or nitrogen such as a silicon oxide film, a silicon nitride film, or a silicon oxynitride film (represented as $SiO_xN_y$).

It is effective to radiate heat generated by the TFTs by making the base film 12 have a heat radiating effect, in order to prevent deterioration of the TFTs and deterioration of the EL element. Any conventional material may be used to make the base film 12 have a heat radiating effect.

Here, two TFTs are formed in a pixel. A TFT 201 for switching is formed of an n-channel TFT while a TFT 202 for controlling electric current is formed of a p-channel TFT.

However, it is not necessary to limit the TFT for switching to be an n-channel TFT and to limit the TFT for controlling electric current to be a p-channel TFT. The TFT for switching may be a p-channel TFT and the TFT for controlling electric current may be an n-channel TFT, or both TFTs may be formed of n-channel TFTs, or both TFTs may be formed of p-channel TFTs.

The TFT 201 for switching is formed so as to have an active layer including a source region 13, a drain region 14, LDD regions 15a to 15d, a heavily doped impurity region 16, and channel forming regions 17a and 17b, as well as a gate insulating film 18, gate electrodes 19a and 19b, a first interlayer insulating film 20, a source wiring 21, and a drain wiring 22.

Figure 3C:
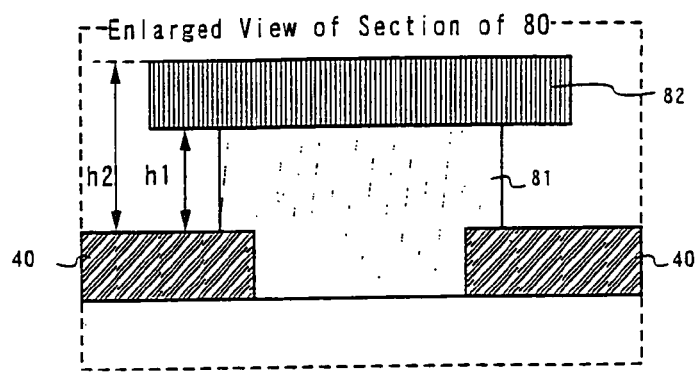

As illustrated in FIGS. 3A to 3C, the TFT 201 for switching has a double-gate structure where the gate electrodes 19a and 19b are electrically connected to each other through a gate wiring 211 formed of a different material (a material having a lower resistance than that of the gate electrodes 19a and 19b).

Of course, instead of the double gate structure, the TFT 201 for switching may have a single-gate structure or a multi-gate structure (a structure including an active layer having two or more serially connected channel forming regions) such as a triple-gate structure. A multi-gate structure is very effective in decreasing the off current value. Here, by making the switching element 201 of the pixel have the multi-gate structure, a switching element having a small off current value is realized.

The active layer is formed of a semiconductor film containing a crystal structure. The active layer may be a single crystal semiconductor film, a polycrystalline semiconductor film, or a microcrystalline semiconductor film. The gate insulating film 18 may be an insulating film containing silicon. As the gate electrodes, the source wiring, and the drain wiring, any conductive film may be used.

Further, in the TFT 201 for switching, the LDD regions 15*a* to 15*d* are provided so as not to overlap the gate electrodes 19*a* and 19*b* through the gate insulating film 18. Such a structure is very effective in decreasing the off current value.

It is to be noted that to provide an offset region (a region which is formed of a semiconductor layer of the same composition as that of the channel forming region and to which gate voltage is not applied) between the channel forming region and the LDD regions is further preferable in decreasing the off current value. Further, in the case of a multi-gate structure having two or more gate electrodes, the heavily doped impurity region provided between elements of the channel forming region is effective in decreasing the off current value.

The TFT 202 for controlling electric current is formed so as to have an active layer including a source region 31, a drain region 32, and a channel forming region 34, as well as the gate insulating film 18, a gate electrode 35, the first interlayer insulating film 20, a source wiring 36, and a drain wiring 37. It is to be noted that, though the gate electrode 35 is of a single-gate structure in the figure, it may be of a multi-gate structure.

As illustrated in FIG. 2, a drain of the TFT 201 for switching is connected to a gate of the TFT 202 for controlling electric current. More specifically, the gate electrode 35 of the TFT 202 for controlling electric current is electrically connected to the drain region 14 of the TFT 201 for switching through the drain wiring (which may be the to be a connection wiring) 22. The source wiring 36 is connected to a power supply line 212.

The TFT 202 for controlling electric current is an element for controlling the amount of electric current to flow in an EL element 203. However, taking into consideration the deterioration of the EL element 203, it is not preferable that a large amount of electric current flows in the EL element 203. Therefore, in order to prevent an excess amount of electric current from flowing in the TFT 202 for controlling electric current, it is preferable that the channel length (L) is designed to be longish. It is desirable that the channel length per pixel is 0.5 to 2 μÅ (preferably 1 to 1.5 μÅ).

The length (width) of an LDD region formed in the TFT 201 for switching may be 0.5 to 3.5 μm, representatively 2.0 to 2.5 μm.

As illustrated in FIGS. 3A to 3C, the wiring including the gate electrode 35 of the TFT 202 for controlling electric current overlaps the power supply line 212 of the TFT 202 for controlling electric current through the insulating film in a region denoted by 50. Here, a storage capacitor is formed in the region 50. A capacitor formed of a semiconductor film 51, an insulating film (not shown) as the same layer as the gate insulating film, and the power supply line 212 can be also used as a storage capacitor.

The storage capacitor 50 functions as a capacitor for storing voltage applied to the gate electrode 35 of the TFT 202 for controlling electric current.

Further, from the viewpoint of increasing the amount of flowable electric current, it is also effective to increase the thickness of the active layer (in particular, the channel forming region) of the TFT 202 for controlling electric current (preferably 50 to 100 nm, and more preferably 60 to 80 nm). On the contrary, with regard to the TFT 201 for switching, from the viewpoint of decreasing the off current value, it is also effective to decrease the thickness of the active layer (in particular, the channel forming region) (preferably 20 to 50 nm, and more preferably 25 to 40 nm).

A first passivation film 38 is formed at the thickness of 10 nm to 10 μm (preferably 200 to 500 nm). As the material, an insulating film containing silicon (especially, a silicon oxynitride film or a silicon nitride film is preferable) can be used.

A second interlayer insulating film (which may also be referred to as a planarizing film) 39 is formed on the first passivation film 38 so as to cover the respective TFTs to level a level difference formed by the TFTs. As the second interlayer insulating film 39, an organic resin film of such as a polyimide resin, a polyamide resin, an acrylic resin, or BCB (benzocyclobutene) is preferable. Of course, an inorganic film may also be used if it can perform sufficient planarization.

It is quite important to planarize, by the second interlayer film 39, a level difference formed by the TFT. Since an EL layer to be formed later is very thin, existence of a level difference may cause light emission failure. Therefore, it is preferable that planarization is performed prior to the formation of the pixel electrode in order to make as level as possible the surface on which the EL layer is formed.

After a contact hole (an opening) is formed in the second interlayer insulating film 39 and the first passivation film 38, a pixel electrode 40 (corresponding to an anode of the EL element) of a transparent conductive film is formed so as to be connected at the formed opening to the drain wiring 37 of the TFT 202 for controlling electric current.

According to this embodiment, as the pixel electrode, a conductive film formed of a compound of indium oxide and tin oxide is used. A small amount of gallium may be doped into the compound. Further, a compound of indium oxide and zinc oxide, or a compound of zinc oxide and gallium oxide may be used.

After the pixel electrode is formed, banks of a resin material are formed. A bank a (41*a*) and a bank b (41*b*) are formed by, using resist materials, patterning organic resin films having different selection ratios. It is to be noted that, here, by etching the bank a (41*a*) and the bank b (41*b*) after they are laminated, the shape illustrated in FIG. 2 can be formed due to the difference in the etching rate. It is to be noted that, here, the relationship of (the etching rate of the resin forming the bank a)>(the etching rate of the resin forming the bank b) is established. The bank a (41*a*) and the bank b (41*b*) are formed to be stripe-like between the pixels as illustrated in FIG. 3C. It is to be noted that, preferably, h1 in FIG. 3C is 0.5 to 3 μm and larger in thickness than a film formed by laminating an EL layer, a cathode, and a protective electrode. Though the banks are formed along the source wiring 21 in this embodiment, they may be formed along the gate wiring 211.

Then, an EL layer 42 is formed by the thin film forming method as described with reference to FIGS. 1A and 1B. It is to be noted that, though only one pixel is illustrated here, actually, EL layers corresponding to R (red), G (green), and B (blue), respectively, are formed as illustrated in FIGS. 1A and 1B.

First, an EL material contained in the sample boat 111 is vaporized by resistance heating using the electrode 120. Just as the EL material in a vapor state is discharged from the sample boat 111, under the influence of an electric field generated by the electrode 112 attached at an opening of the sample boat 111, the EL material in a vapor state is charged to be charged particles. The direction of progress of these charged particles is controlled when they pass through the mask 113 by an electric field around the mask 113 generated by voltage applied to blocking portions 118.

It is to be noted that an electrode may be provided between the sample boat 111 and the mask 113 to control the charge of the EL material in a vapor state discharged from the sample boat 111 by an electric field generated by the electrode.

As a result, the vapor EL material passes through gaps between the blocking portions 118 to be deposited on the surface of the substrate where it is to be formed.

It is to be noted that blocking portions of a mask as used in this specification refer to portions formed of a conductive material of the mask, and examples of the conductive material include titanium, tantalum, tungsten, and aluminum. Further, openings in the mask refer to gaps between the blocking portions.

Further, a surface where an EL material is to be formed as used in this specification refers to a part of the surface of a pixel electrode or an organic film where a thin film is to be formed.

The voltage applied to the mask is equal to or more than several 10 V and equal to or less than 10 kV, preferably 10 V to 1 kV. Those who implement the present invention may appropriately set the voltages to the respective electrodes in this range.

In this embodiment, first, by vaporizing and depositing the red EL material contained in the sample boat 111, a pixel column that emits red light is formed on the pixels. Then, after the mask is moved in a lateral direction (a direction shown by an arrow k), the green EL material contained in the sample boat 111 is deposited through evaporation to form a pixel column that emits green light. The mask is further moved in the lateral direction (the direction shown by the arrow k) and the blue EL material contained in the sample boat 111 is deposited through evaporation to form a pixel column that emits blue light.

It is to be noted that the sample boat 111 having the EL material contained therein may be changed every time when the kind of the EL material is changed, or, alternatively, only the EL material to be used may be changed without changing the sample boat 111.

Further, the sample boat 111 and the mask described here may be separately provided, or, alternatively, may be integrally formed as one device.

As described in the above, by depositing through evaporation in three installments the pixel columns emitting red, green, and blue light, respectively, as the mask is moved, the stripe-like EL layers of the three colors are formed.

As the EL materials to be the EL layers, low molecular weight materials may be used. Representative low molecular weight materials for the EL materials include tris(8-quinolinolate) aluminum complex (Alq) and bis(benzoquinolinolate) beryllium complex (BeBq).

It is to be noted that, in this embodiment, Alq as a host material with a red fluorescent pigment DCM doped therein is used as the EL material for forming a red EL layer, Alq that is a complex of aluminum and 8-hydroxyquinoline is used as the green EL layer, and a complex of zinc and benzoxazole (Zn(oxz)$_2$) is used as the blue EL layer.

However, the above are merely examples of the EL materials that can be used as the EL layers of this embodiment, and the present invention is by no means limited thereto.

In other words, macromolecular organic EL materials that are not listed herein may be used with a coating method and the EL layers may be formed using macromolecular materials in addition to the low molecular weight materials.

Further, when the EL layer 42 is formed, since the EL layer is easily deteriorated by the existence of moisture and oxygen, it is preferable that the processing be performed in an inert gas such as nitrogen or argon which contains little moisture and oxygen.

After the EL layer 42 is formed as in the above, a cathode 43 formed of a light-shielding conductive film, a protective electrode 44, and a second passivation film 45 are formed. In this embodiment, a conductive film formed of MgAg is used as the cathode 43, a conductive film formed of aluminum is used as the protective electrode 44, and a silicon nitride film with a thickness of 10 nm to 10 μm (preferably 200 to 500 nm) is used as the second passivation film 45.

It is to be noted that, as described in the above, since the EL layer is easily affected by heat, the cathode 43 and the second passivation film 45 are desirably formed at a temperature as low as possible (preferably in the temperature range of from room temperature to 120° C.). Therefore, in this case, plasma enhanced CVD, vacuum evaporation, or spin coating is a preferable film forming method.

The device in this stage of completion is referred to as an active matrix substrate. An opposing substrate (not shown) is provided so as to be opposed to the active matrix substrate. In this embodiment, a glass substrate is used as the opposing substrate. It is to be noted that, as the opposing substrate, a substrate formed of plastic or ceramics may also be used.

The active matrix substrate and the opposing substrate are adhered to each other by a sealing material (not shown) to form a sealed space (not shown). In this embodiment, the sealed space is filled with argon gas. Of course, a desiccant such as barium oxide or an antioxidant can be disposed inside the sealed space.

Further, the structure of this embodiment can be freely combined with the structure of Embodiment 1.

Embodiment 3

Here, a method of forming a bank consisting of the bank a and the bank b illustrated in FIG. 3C is described. Both the bank a and the bank b are of positive type.

First, after a pixel electrode is formed, an organic resin film of melamine resin to be the bank a is formed. A dye is mixed in the melamine resin to make the organic resin film have a function as an antireflection film. These may be used after being dissolved in a solvent such as dimethylacetamide. It is to be noted that, in selecting the dye, it is necessary to select a dye having emission spectrum near the spectrum of light used in exposure.

Then, a polyimide film is laminated on the melamine resin film. Here, photosensitive polyimide or a novolac resin may be used instead of polyimide. This is to form the bank b.

It is to be noted that the organic resin film formed here has two layers. The organic resin film is then exposed to light to be patterned. As the developer for the patterning, a water-soluble one is preferably used. In this embodiment, tetramethyl ammonium hydroxide may be used, since it is water-soluble and alkaline, and thus, suitable for this embodiment. However, the developer is not limited thereto, and other conventional developers may also be used.

By developing using the developer, the bank a and the bank b are shaped as illustrated in FIG. 3C. This is because, by mixing the dye in the bank a, its strength against exposure has changed, and thus, is etched isotropically by the developer. It is to be noted that h2 shown here is preferably 0.5 to 3 µm.

It is to be noted that the bank a and the bank b are not limited to the laminated structure of the organic resin film as described above. The banks may be formed such that the bank b is formed of an organic resin film such as a polyimide resin, a polyamide resin, or a photosensitive resin after the bank a is formed of an inorganic film such as silicon oxide or silicon nitride, or the material used for the bank a and the material used for the bank b may be reversed.

It is to be noted that the structure of this embodiment can be freely combined with the structures of Embodiments 1 and 2.

Embodiment 4

A method of simultaneously forming a pixel portion and TFTs of a driver circuit portion formed in the periphery of the pixel portion, is explained here with reference to FIGS. 4 to 6. Note that in order to simplify the explanation, a CMOS circuit is shown as a basic circuit for the driver circuits.

First, as shown in FIG. 4A, a base film 301 is formed with a 300 nm thickness on a glass substrate 300. As the base film 301, a silicon oxynitride film having a thickness of 100 nm is laminated on a silicon oxynitride film having a thickness of 200 nm in this embodiment. It is good to set the nitrogen concentration at between 10 and 25 wt% in the film contacting the glass substrate 300. Needless to say, elements can be formed on the quartz substrate without providing the base film.

Next, an amorphous silicon film (not shown in the figures) is formed with a thickness of 50 nm on the base film 301 by a known deposition method. Note that it is not necessary to limit this to the amorphous silicon film, and a semiconductor film containing an amorphous structure (including a microcrystalline semiconductor film) may be used. In addition, a compound semiconductor film containing an amorphous structure, such as an amorphous silicon-germanium film, may also be used. Further, the film thickness may be made from 20 to 100 nm.

The amorphous silicon film is then crystallized by a known method, forming a crystalline silicon film (also referred to as a polycrystalline silicon film or a poly-crystalline silicon film) 302. Thermal crystallization using an electric furnace, laser annealing crystallization using a laser, and lamp annealing crystallization using an infrared lamp are included in known crystallization methods. Crystallization is performed in this embodiment using an excimer laser light which uses XeCl gas.

Note that pulse emission type excimer laser light formed into a linear shape is used in this embodiment, but a rectangular shape may also be used, and continuous emission argon laser light and continuous emission excimer laser light can also be used.

In this embodiment, although the crystalline silicon film is used as an active layer of the TFT, it is also possible to use an amorphous silicon film. Further, it is possible to form the active layer of the TFT for switching, in which there is a necessity to reduce the off current, by the amorphous silicon film, and to form the active layer of the current control TFT by the crystalline silicon film. Electric current flows with difficulty in the amorphous silicon film because the carrier mobility is low, and the off current does not easily flow. In other words, the most can be made of the advantages of both the amorphous silicon film, through which current does not flow easily, and the crystalline silicon film, through which current easily flows.

Next, as shown in FIG. 4B, a protective film 303 is formed on the crystalline silicon film 302 made of a silicon oxide film having a thickness of 130 nm. This thickness may be chosen within the range of 100 to 200 nm (preferably between 130 and 170 nm). Furthermore, other films such as insulating films containing silicon may also be used. The protective film 303 is formed so that the crystalline silicon film is not directly exposed to plasma during addition of an impurity, and so that it is possible to have delicate concentration control of the impurity.

Resist masks 304a and 304b are then formed on the protective film 303, and an impurity element which imparts n-type conductivity (hereafter referred to as an n-type impurity element) is added via the protective film 303. Note that elements residing in periodic table group 15 are generally used as the n-type impurity element, and typically phosphorous or arsenic can be used. Note that a plasma doping method is used, in which phosphine ($PH_3$) is plasma excited without separation of mass, and phosphorous is added at a concentration of $1 \times 10^{18}$ atoms/$cm^3$ in this embodiment. An ion implantation method, in which separation of mass is performed, may also be used, of course.

The dose amount is regulated so that the n-type impurity element is contained in n-type impurity regions 305 formed in accordance with this step at a concentration of $2 \times 10^{16}$ to $5 \times 10^{19}$ atoms/$cm^3$ (typically between $5 \times 10^7$ and $5 \times 10^{18}$ atoms/$cm^3$).

Next, as shown in FIG. 4C, the protective film 303, resist masks 304a and 304b are removed, and an activation of the added periodic table group 15 elements is performed. A known technique of activation may be used as the means of activation, but activation is done in this embodiment by irradiation of excimer laser light. Of course, a pulse emission type excimer laser and a continuous emission type excimer laser may be used, and it is not necessary to limit on the use of excimer laser light. The goal is the activation of the added impurity element, and it is preferable that irradiation is performed at an energy level at which the crystalline silicon film does not melt. Note that the laser irradiation may also be performed with the protective film 303 in place.

The activation by heat treatment may also be performed along with activation of the impurity element by laser light. When activation is performed by heat treatment, considering the heat resistance of the substrate, it is good to perform heat treatment at a temperature of about 450 to 550° C.

A boundary portion (connecting portion) with end portions of the n-type impurity region 305, namely region, in which the n-type impurity element is not added, on the periphery of the n-type impurity region 305, is not added, is delineated by this process. This means that, at the point when the TFTs are later completed, extremely good connections can be formed between LDD regions and channel forming regions.

Unnecessary portions of the crystalline silicon film are removed next, as shown in FIG. 4D, and island-like semiconductor films (hereafter referred to as active layers) 306 to 309 are formed.

Then, as shown in FIG. 4E, a gate insulating film 310 is formed, covering the active layers 306 to 309. An insulating film containing silicon is formed to a thickness of 10 to 200 nm, preferably between 50 and 150 nm, as the gate insulating film 310. A single layer structure or a lamination structure may be used. A 110 nm thick silicon oxynitride film is used in this embodiment.

Thereafter, a conductive film having a thickness of 200 to 400 nm is formed and patterned to form gate electrodes 311 to 315. Respective end portions of these gate electrodes 311 to 315 may be tapered. In the present embodiment, the gate electrodes and wirings (hereinafter referred to as the gate wirings) electrically connected to the gate electrodes for providing lead wires are formed of different materials from each other. More specifically, the gate wirings are made of a material having a lower resistivity than the gate electrodes. Thus, a material enabling fine processing is used for the gate electrodes, while the gate wirings are formed of a material that can provide a smaller wiring resistance but is not suitable for fine processing. It is of course possible to form the gate electrodes and the gate wirings with the same material.

Although the gate electrode can be made of a single-layered conductive film, it is preferable to form a lamination film with two, three or more layers for the gate electrode if necessary. Any known conductive materials can be used for the gate electrode. It should be noted, however, that it is preferable to use such a material that enables fine processing, and more specifically, a material that can be patterned with a line width of 2 μm or less.

Typically, it is possible to use a film made of an element selected from tantalum (Ta), titanium (Ti), molybdenum (Mo), tungsten (W), chromium (Cr), and silicon (Si), a film of nitride of the above element (typically a tantalum nitride film, a tungsten nitride film, or a titanium nitride film), an alloy film of combination of the above elements (typically Mo—W alloy, Mo—Ta alloy), or a silicide film of the above element (typically a tungsten silicide film or titanium silicide film). Of course, the films may be used as a single layer or a laminate layer.

In this embodiment, a laminate film of a tantalum nitride (TaN) film having a thickness of 50 nm and a tantalum (Ta) film having a thickness of 350 nm is used. This may be formed by a sputtering method. When an inert gas of Xe, Ne or the like is added as a sputtering gas, film peeling due to stress can be prevented.

The gate electrode 312 is formed at this time so as to overlap and sandwich a portion of the n-type impurity regions 305 and the gate insulating film 310. This overlapping portion later becomes an LDD region overlapping the gate electrode. Further the gate electrodes 313 and 314 appears two electrodes by a cross sectional view, practically, they are connected each other electrically.

Figure 5A:
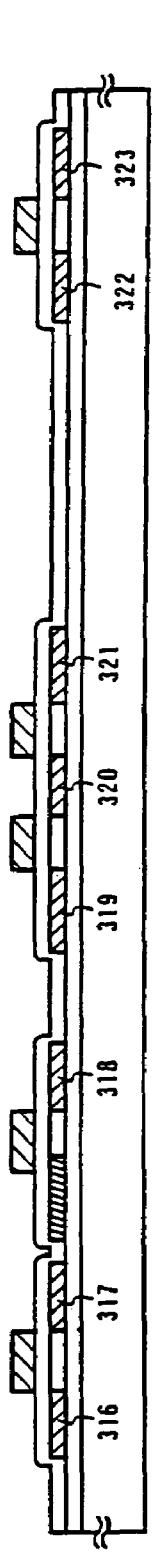
FIGS. 5A to 5D are diagrams illustrating the process of manufacturing an EL display device.

Next, an n-type impurity element (phosphorous in this embodiment) is added in a self-aligning manner with the gate electrodes 311 to 315 as masks, as shown in FIG. 5A. The addition is regulated so that phosphorous is added to impurity regions 316 to 323 thus formed at a concentration of 1/10 to 1/2 that of the n-type impurity region 305 (typically between 1/4 and 1/3). Specifically, a concentration of $1\times10^{16}$ to $5\times10^{18}$ atoms/cm$^3$ (typically $3\times10^{17}$ to $3\times10^{18}$ atoms/cm$^3$) is preferable.

Figure 5B:
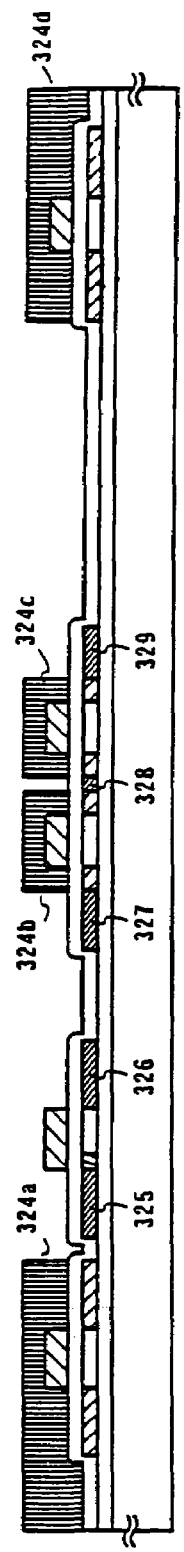

Resist masks 324a to 324d are formed next, with a shape covering the gate electrodes etc., as shown in FIG. 5B, and an n-type impurity element (phosphorous is used in this embodiment) is added, forming impurity regions 325 to 329 containing high concentration of phosphorous. Ion doping using phosphine (PH$_3$) is also performed here, and is regulated so that the phosphorous concentration of these regions is from $1\times10^{20}$ to $1\times10^{21}$ atoms/cm$^3$ (typically between $2\times10^{20}$ and $5\times10^{21}$ atoms/cm$^3$).

A source region or a drain region of the n-channel type TFT is formed by this process, and in the TFT for switching, a portion of the n-type impurity regions 319 to 321 formed by the process of FIG. 5A is remained. These remaining regions correspond to the LDD regions 15a to 15d of the TFT for switching 201 in FIG. 5.

Figure 5C:
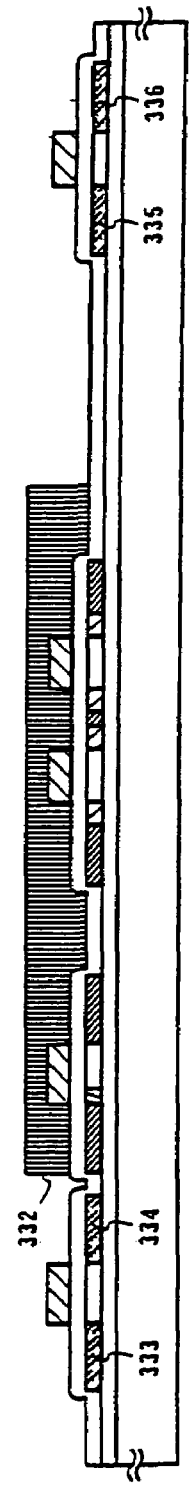

Next, as shown in FIG. 5C, the resist masks 324a to 324d are removed, and a new resist mask 332 is formed. A p-type impurity element (boron is used in this embodiment) is then added, forming impurity regions 333 to 336 containing boron at high concentration. Boron is added here to form impurity regions 333 to 336 at a concentration of $3\times10^{20}$ to $3\times10^{21}$ atoms/cm$^3$ (typically between $5\times10^{20}$ and $1\times10^{21}$ atoms/cm$^3$) by ion doping using diborane (B$_2$H$_6$).

Note that phosphorous has already been added to the impurity regions 333 to 336 at a concentration of $1\times10^{20}$ to $1\times10^{21}$ atoms/cm$^3$, but boron is added here at a concentration of at least not less than three times that of the phosphorous. Therefore, the n-type impurity regions already formed completely invert to p-type, and function as p-type impurity regions.

Next, after removing the resist mask 332, the n-type and p-type impurity elements added to the active layer at respective concentrations are activated. Furnace annealing, laser annealing or lamp annealing can be used as a means of activation. In this embodiment, heat treatment is performed for 4 hours at 550° C. in a nitrogen atmosphere in an electric furnace.

At this time, it is important to eliminate oxygen from the surrounding atmosphere as much as possible. This is because when even only a small amount of oxygen exists, an exposed surface of the gate electrode is oxidized, which results in an increased resistance and later makes it difficult to form an ohmic contact with the gate electrode. Accordingly, the oxygen concentration in the surrounding atmosphere for the activation process is set at 1 ppm or less, preferably at 0.1 ppm or less.

Figure 5D:
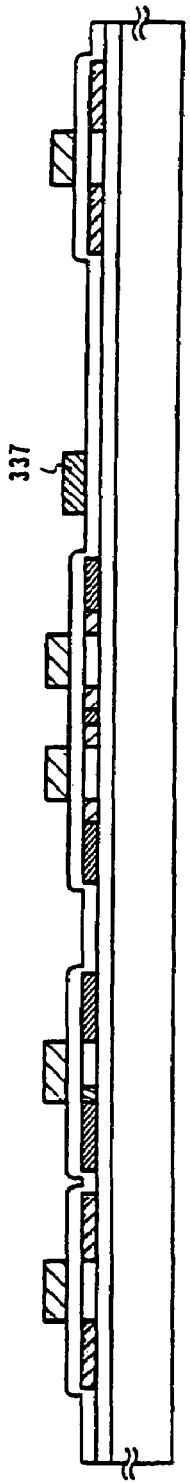

After the activation process is completed, the gate wiring 337 having a thickness of 300 nm is formed as shown in FIG. 5D. As a material for the gate wiring 337, metal containing aluminum (Al) or copper (Cu) as its main component (occupied 50 to 100% in the composition) can be used. As shown in FIG. 3, the gate wiring 211 is arranged to provide electrical connection for the gate electrodes 19a and 19b (corresponding to the gate electrodes 313 and 314 in FIG. 4E) of the switching TFT.

The above-described structure can allow the wiring resistance of the gate wiring to be significantly reduced, and therefore, an image display region (pixel portion) with a large area can be formed. More specifically, the pixel structure in accordance with the present embodiment is advantageous for realizing an EL display device having a display screen with a diagonal size of 10 inches or larger (or 30 inches or larger.)

A first interlayer insulating film 338 is formed next, as shown in FIG. 6A. A single layer insulating film containing silicon is used as the first interlayer insulating film 338, while a lamination film, which is a combination of insulating films including two or more kinds of silicon, may be used. Further, a film thickness of between 400 nm and 1.5 μm may be used. A lamination structure of a silicon oxide film having a thickness of 800 nm on a silicon oxynitride film having a thickness of 200 nm is used in this embodiment.

In addition, heat treatment is performed for 1 to 12 hours at 300 to 450 C in an atmosphere containing between 3 and 100% hydrogen, performing hydrogenation. This process is one of hydrogen termination of dangling bonds in the semiconductor film by hydrogen which is thermally excited. Plasma hydrogenation (using hydrogen activated by a plasma) may also be performed as another means of hydrogenation.

Note that the hydrogenation processing may also be inserted during the formation of the first interlayer insulating film 338. Namely, hydrogen processing may be performed as above after forming the 200 nm thick silicon oxynitride film, and then the remaining 800 nm thick silicon oxide film may be formed.

Next, a contact hole is formed in the first interlayer insulating film 338 and the gate insulating film 310, and source wirings 339 to 342 and drain wirings 343 to 345 are formed. In this embodiment, this electrode is made of a lamination film of three-layer structure in which a titanium film having a thickness of 100 nm, an aluminum film containing titanium and having a thickness of 300 nm, and a titanium film having a thickness of 150 nm are continuously formed by a sputtering method. Of course, other conductive films may be used.

A first passivation film 346 is formed next with a thickness of 50 to 500 nm (typically between 200 and 300 nm). A 300 nm thick silicon oxynitride film is used as the first passivation film 346 in this embodiment. This may also be substituted by a silicon nitride film.

Note that it is effective to perform plasma processing using a gas containing hydrogen such as $H_2$ or $NH_3$ etc. before the formation of the silicon oxynitride film. Hydrogen excited by this pre-process is supplied to the first interlayer insulating film 338, and the film quality of the first passivation film 346 is improved by performing heat treatment. At the same time, the hydrogen added to the first interlayer insulating film 338 diffuses to the lower side, and the active layers can be hydrogenated effectively.

Next, as shown in FIG. 6B, a second interlayer insulating film 347 made of organic resin is formed. As the organic resin, it is possible to use polyimide, polyamide, acrylic resin, BCB (benzocyclobutene) or the like. Especially, since the second interlayer insulating film 347 is primarily used for flattening, acrylic resin excellent in flattening properties is preferable. In this embodiment, an acrylic resin film is formed to a thickness sufficient to flatten a stepped portion formed by TFTs. It is appropriate that the thickness is made 1 to 5 μm (more preferably, 2 to 4 μm).

Thereafter, a contact hole is formed in the second interlayer insulating film 347 and the first passivation film 346 and then the pixel electrode 348 electrically connected to a drain wiring 345 is formed. In this embodiment, an indium tin oxide film (ITO) is formed to a thickness of 110 nm and patterned to form a pixel electrode. In addition, a compound of indium oxide and zinc oxide (ZnO) of 2-20% or a compound of zinc oxide and gallium oxide also can be used as a transparent electrode. This pixel electrode becomes an anode of an EL element.

Then, as illustrated in FIG. 6C, a bank a (349a) and a bank b (349b) formed of a resin material are formed. The bank a (349a) and the bank b (349b) are formed by laminating and patterning acrylic resin films, polyimide films, or the like at a thickness of 1 to 2 μm in total. It is to be noted that the material of the film for forming the bank a (349a) is required to have a higher etching rate than that of the film for forming the bank b (349b) with regard to the same etchant. As illustrated in FIG. 6, the bank a (349a) and the bank b (349b) are formed between pixels so as to be stripe-like. Though they are formed along a source wiring 341 in this embodiment, they may be formed along a gate wiring 337.

Then, an EL layer 350 is formed by the thin film forming method as described with reference to FIG. 1. It is to be noted that, though only one pixel is illustrated here, actually, EL layers corresponding to R (red), G (green), and B (blue), respectively, are formed as illustrated in FIG. 1.

First, an EL material contained in the sample boat is vaporized by resistance heating using the electrode to be the EL material in a vapor state. The EL material in a vapor state is, after being charged intentionally, discharged. The discharged EL material in a vapor state is, after being passed through the mask to which voltage is applied, deposited on the pixel portion on the substrate 110. It is to be noted that when the EL material in a vapor state is passed through the mask, the direction of progress of the EL material in a vapor state is controlled by an electric field around the mask.

In this embodiment, first, by discharging from the sample boat a red EL material as an EL material in a vapor state, a pixel column that emits red light is formed on the pixels. Then, after the mask is moved in a lateral direction, a green EL material is deposited by evaporation from the sample boat to form a pixel column that emits green light. The mask is further moved in the lateral direction and a blue EL material is deposited by evaporation from the sample boat to form a pixel column that emits blue light.

As described in the above, by depositing in three installments the pixel columns emitting red, green, and blue light, respectively, while moving the mask, the stripe-like EL layers of three colors are formed.

It is to be noted that, though only one pixel is illustrated in this embodiment, EL layers emitting the same color are simultaneously formed here.

It is to be noted that, in this embodiment, Alq as a host material with a red fluorescent pigment DCM doped therein is used as the EL material for forming a red EL layer, Alq which is a complex of aluminum and 8-hydroxyquinoline is used as the green emitting EL layer, and a complex of zinc and benzoxazole $(Zn(oxz)_2)$ is used as the blue emitting EL layer, all at a thickness of 50 nm.

A known material can be used as the EL material 350. Taking into consideration the driving voltage, such a known material is preferably an organic material. It is to be noted that, though the EL layer 350 is of a single layer structure having only the above EL layer in this embodiment, it may be provided with an electron injection layer, an electron transmission layer, a hole transmission layer, a hole injection layer, an electron blocking layer, or a hole element layer, if necessary. Further, though a case where an MgAg electrode is used as a cathode 351 of the EL element is described in this embodiment, other known materials may also be used.

Further, though the EL layers are deposited with regard to each color, the electron injection layer, the electron transmission layer, the hole transmission layer, the hole injection layer, the electron blocking layer, or the hole element layer in the EL layer may be formed simultaneously by, for example, spin coating or evaporation of the same material irrespective of the color of the EL layer.

After the EL layer 350 is formed, the cathode (MgAg electrode) 351 is formed by vacuum evaporation. It is to be noted that the thickness of the EL layer 350 is preferably 80 to 200 nm (typically 100 to 120 nm) and the thickness of the cathode 351 is preferably 180 to 300 nm (typically 200 to 250 nm).

Further, a protective electrode 352 is provided on the cathode 351. As the protective electrode 352, a conductive film comprising aluminum as the main component may be used. The protective electrode 352 may be formed by vacuum evaporation using a mask.

Finally, a second passivation film 353 of a silicon nitride film is formed at a thickness of 300 nm. Though, actually, the protective electrode 352 protects the EL layer from moisture and the like, by further forming the second passivation film 353, the reliability of the EL element can be further enhanced.

FIG. 7 illustrates the cross section of an n-channel TFT for switching as a TFT in the pixel portion.

Figure 7A:
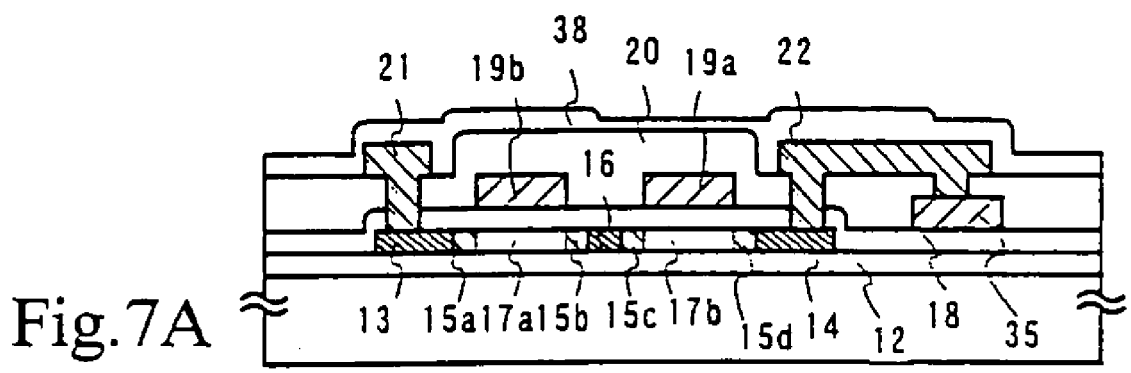
FIGS. 7A and 7B are diagrams illustrating the structure in section of a TFT in a pixel portion of an EL display device.

First, with regard to the TFT for switching illustrated in FIG. 7, FIG. 7A illustrates a structure where LDD regions 15a to 15d are provided so as not to overlap the gate electrodes 19a and 19b through a gate insulating film 18. Such a structure is very effective in decreasing the off current value.

Figure 7B:
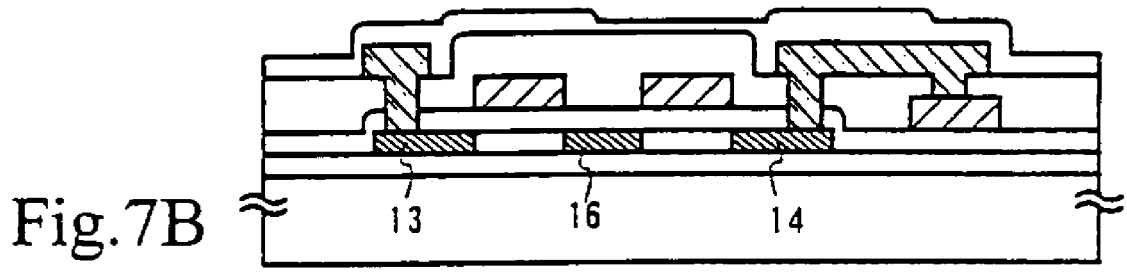

On the other hand, these LDD regions 15a to 15d are not provided in a structure illustrated in FIG. 7B. In the case that the structure illustrated in FIG. 7B is formed, since the number of the processes steps can be decreased compared with the case where the structure illustrated in FIG. 7A is formed, the production efficiency can be improved.

In this embodiment, both of the structures illustrated in FIG. 7A and FIG. 7B may be used as the TFT for switching.

FIG. 8 illustrates the cross sectional structure of an n-channel TFT for controlling electric current as a TFT in the pixel portion.

Figure 8A:
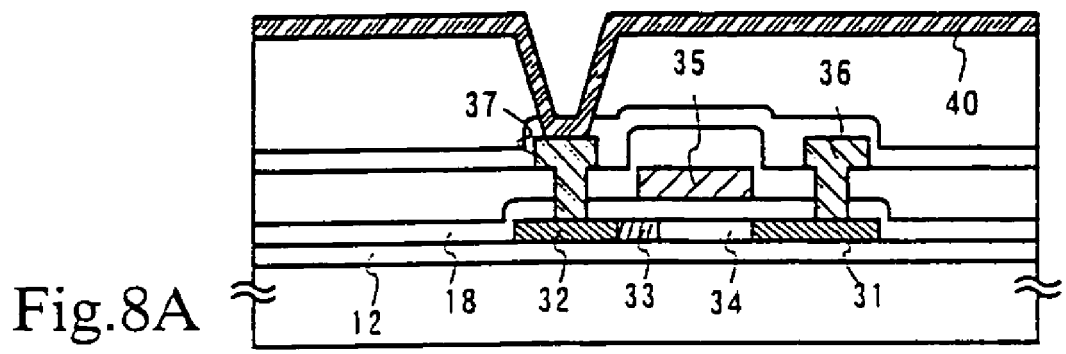
FIGS. 8A and 8B are diagrams illustrating the structure in section of a TFT in a pixel portion of an EL display device.
Figure 8B:
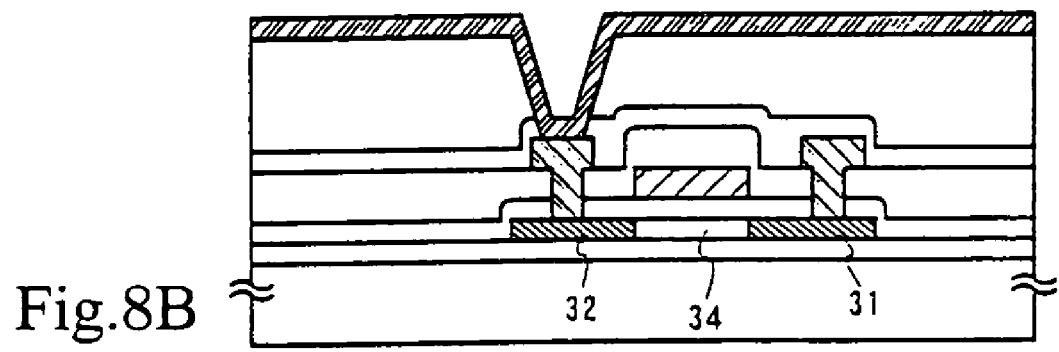

In a TFT for controlling electric current illustrated in FIG. 8A, an LDD region 33 is provided between a drain region 32 and a channel forming region 34. Though a structure where the LDD region 33 overlaps a gate electrode 35 through the gate insulating film 18 is illustrated here, the structure may be as illustrated in FIG. 8B where the LDD region 33 is not provided.

The TFT for controlling electric current not only supplies electric current for making an EL element emit light but also controls the amount of the supply to make gray-scale display possible. Therefore, it is necessary to take measures against deterioration due to hot carrier injection so as to prevent such deterioration even when electric current is caused to flow.

With regard to deterioration due to hot carrier injection, it is known that a structure where an LDD region overlaps a gate electrode is very effective. Therefore, the structure where the LDD region overlaps the gate electrode 35 through the gate insulating film 18 as illustrated in FIG. 8A is appropriate. Here, as an off current measure, a structure in which part of the LDD region does not overlap the gate electrode is illustrated. However, it is not necessarily required that part of the LDD region does not overlap the gate electrode. Further, depending on the situation, as illustrated in FIG. 8B, such an LDD region may not be provided.

In the case of this embodiment, as illustrated in FIG. 6C, the active layer of the n-channel TFT 205 includes a source region 355, a drain region 356, an LDD region 357, and a channel forming region 358. The LDD region 357 overlaps the gate electrode 312 through the gate insulating film 310.

The LDD region is formed only on the side of the drain region, so as not to lower the operation speed. Further, with regard to the n-channel TFT 205, while it is not necessary to consider the off current much, the operation speed is important. Therefore, it is desirable that the LDD region 357 completely overlaps with the gate electrode to make the resistance component as small as possible. In other words, it is preferable that there is no so-called offset.

In this way, the active matrix substrate having the structure as illustrated in FIG. 6C is completed. It is to be noted that to continuously go through processes steps after a bank 349 is formed until a passivation film 353 is formed without exposing the device to the atmosphere using a multi-chamber-type or in-line-type thin film forming device is effective.

By the way, by arranging optimally structured TFTs not only in the pixel portion but also in the driver circuit portion, an active matrix substrate according to this embodiment is extremely reliable, and its performance characteristics can be improved.

First, a TFT structured to decrease hot carrier injection while caring not to lower the operation speed as much as possible is used as the n-channel TFT 205 of the CMOS circuit forming the driver circuit portion. It is to be noted that the driver circuit as referred to herein includes a shift register, a buffer, a level shifter, a sampling circuit (a sample-and-hold circuit), and the like. In the case that digital driving is performed, a signal conversion circuit such as a D/A converter may further be included.

It is to be noted that, actually, after the process step illustrated in FIG. 6C is completed, the device is preferably packaged (enclosed) in a covering material such as airtight glass, quartz, or plastic such that the device is not exposed to the outside air. In this case, a hygroscopic agent such as barium oxide or an antioxidant is preferably disposed inside the covering material.

After the airtightness is enhanced by processing such as the packaging, a connector (a flexible printed circuit: an FPC) for connecting terminals led from elements or circuits formed on the insulator to external signal terminals is attached to complete the device as a product. The device in this state, i.e., in a shippable state is herein referred to as an EL display device (or an EL module).

Here, the structure of the active matrix EL display device according to this embodiment is described with reference to a perspective view of FIG. 9. The active matrix EL display device according to this embodiment includes a pixel portion 602, a gate side driver circuit 603, and a source side driver circuit 604 formed on a glass substrate 601. A TFT 605 for switching in the pixel portion is an n-channel TFT, and is disposed at an intersection of a gate wiring 606 connected to the gate side driver circuit 603 and a source wiring 607 connected to the source side driver circuit 604. A drain of the TFT 605 for switching is connected to a gate of a TFT 608 for controlling electric current.

Further, a source side of the TFT 608 for controlling electric current is connected to a power supply line 609. In a structure as this embodiment, the power supply line 609 has a ground potential (an earth potential). Further, a drain of the TFT 608 for controlling electric current is connected to an EL element 610. Predetermined voltage (3 to 12 V, preferably 3 to 5 V) is applied to an anode of the EL element 610.

Further, an FPC 611 to be an external input/output terminal is provided with connection wirings 612 and 613 for transmitting a signal to a driver circuit portion, and a connection wiring 614 connected to the power supply line 609.

Figure 9:
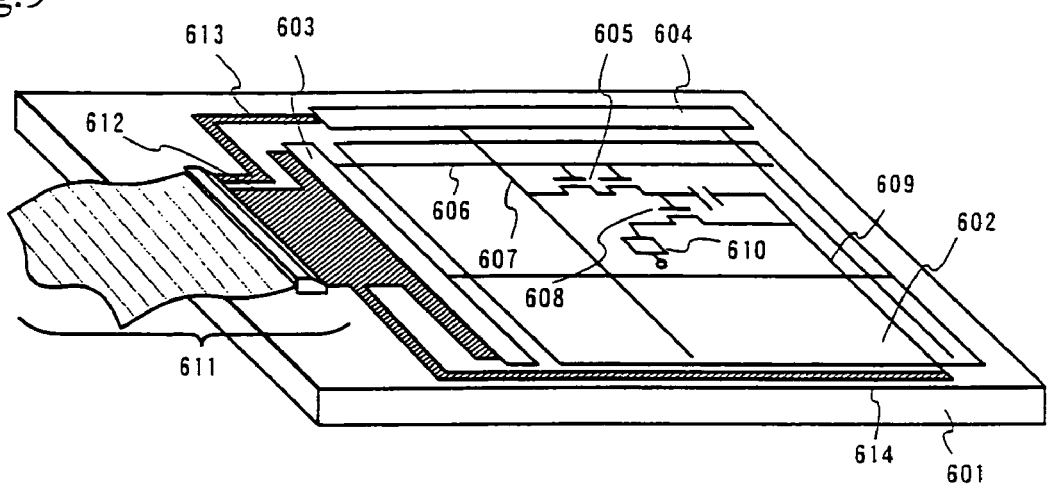
FIG. 9 is a diagram illustrating an outward appearance of an EL display device.
Figure 10:
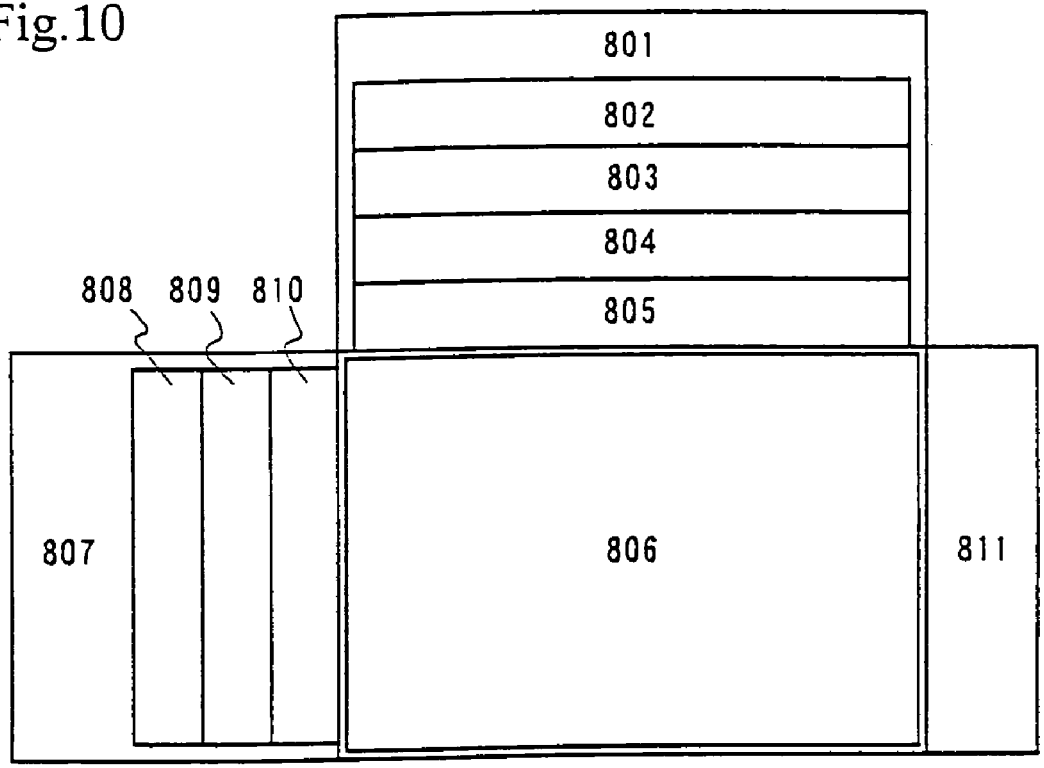
FIG. 10 is a diagram illustrating a circuit block structure of an EL display device.

FIG. 10 illustrates an example of a circuit structure of the EL display device illustrated in FIG. 9. The EL display device according to this embodiment has a source side driver circuit 801, a gate side driver circuit (A) 807, a gate side driver circuit (B) 811, and a pixel portion 806. It is to be noted that the driver circuit portion as used herein is a generic name and includes the source side driver circuit and the gate side driver circuits.

The source side driver circuit 801 is provided with a shift register 802, a level shifter 803, a buffer 804, and a sampling circuit (a sample-and-hold circuit) 805. The gate side driver circuit (A) 807 is provided with a shift register 808, a level shifter 809, and a buffer 810. The gate side driver circuit (B) 811 is similarly structured.

Here, the driving voltage of the shift registers 802 and 808 is 5 to 16 V (representatively 10 V). For an n-channel TFT used in a CMOS circuit forming the circuit, the structure denoted as 205 in FIG. 6C is suitable.

Similarly to the case of the shift registers, for the level shifters 803 and 809 and the buffers 804 and 810, a CMOS circuit including the n-channel TFT 205 illustrated in FIG. 6C is suitable. It is to be noted that to make the gate wirings have a multi-gate structure such as a double-gate structure or a triple-gate structure is effective in improving the reliability of the respective circuits.

In the pixel portion 806, pixels structured as illustrated in FIG. 5 are arranged.

It is to be noted that the above structure can be easily realized by manufacturing the TFTs in accordance with the manufacturing process illustrated in FIGS. 4 to 6. Further, though only the structure of the pixel portion and the driver circuit portion are illustrated in this embodiment, according to the manufacturing process of this embodiment, other logic circuits such as a signal division circuit, a D/A converter circuit, an operational amplifier circuit, and a y correction circuit can also be formed on the same insulator. Further, it is expected that a memory portion, a microprocessor, and the like can also be formed.

Further, the EL module according to this embodiment including a covering material is described with reference to FIGS. 11A and 11B. The reference numerals used in FIGS. 9 and 10 are also used here, if necessary.

Figure 11A:
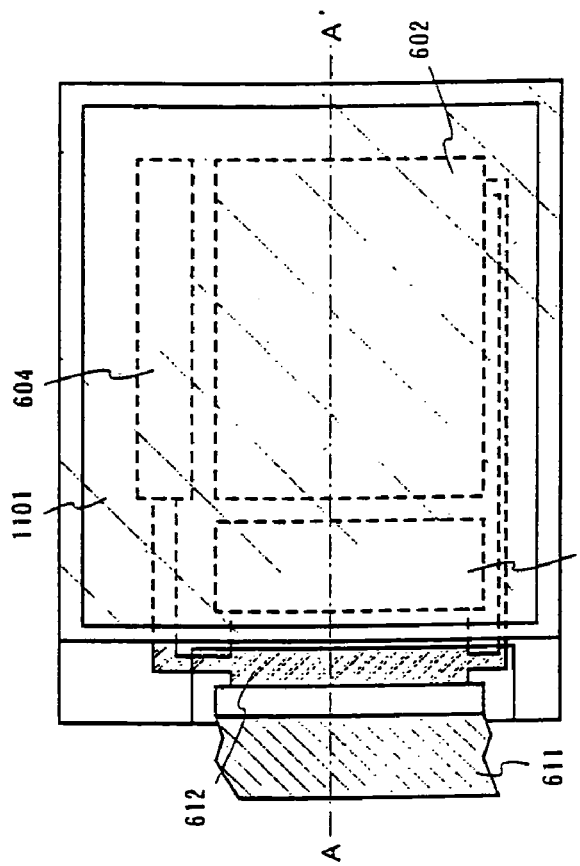
FIGS. 11A and 11B are diagrams showing the structure in section of an active matrix EL display device.

FIG. 11A is a top view showing a sealing structure added to a state illustrated in FIG. 9. Reference numerals 602, 603, and 604 shown by dotted lines denote a pixel portion, a gate side diver circuit, and a source side driver circuit, respectively. The sealing structure according to the present embodiment is a structure provided with a covering material 1101 and a sealing material (not shown) for the state illustrated in FIG. 9.

Figure 11B:
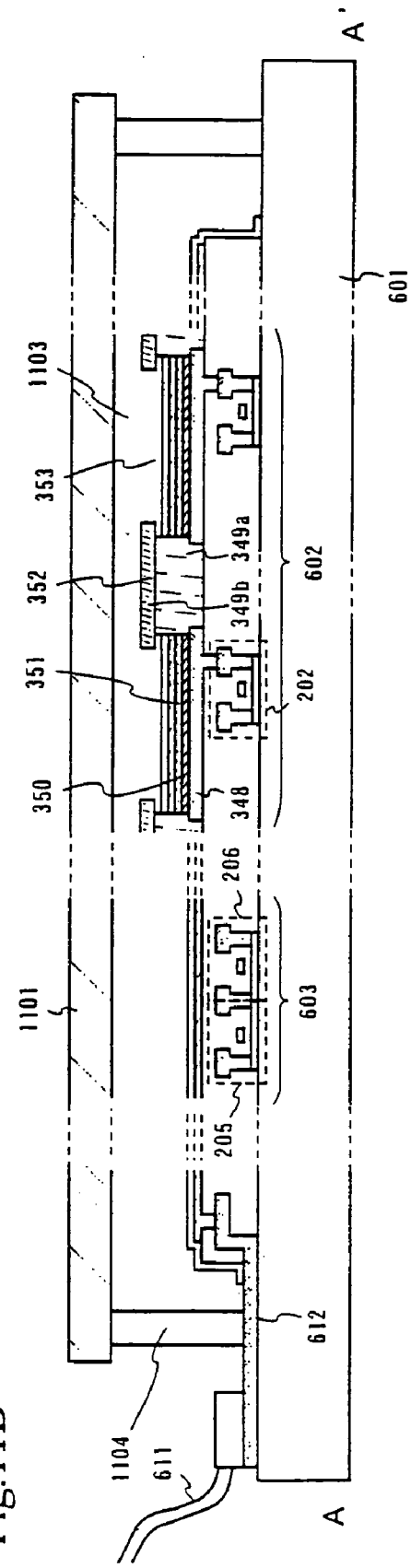

FIG. 11B is a sectional view taken along the line A-A' of FIG. 11A. It is to be noted that the same reference numerals denote the same components in FIGS. 11A and 11B.

As illustrated in FIG. 11B, the pixel portion 602 and the gate side driver circuit 603 are formed on the substrate 601. The pixel portion 602 is formed of a plurality of pixels each composed of the TFT 202 for controlling electric current and the pixel electrode 348 electrically connected thereto. The gate side driver circuit 603 is formed using a CMOS circuit where the n-channel TFT 205 and the p-channel TFT 206 are complementary combined.

The pixel electrode 348 functions as an anode of the EL element. The bank a (349a) and the bank b (349b) are formed in gaps between the pixel electrodes 348. The EL layer 350 and the cathode 351 are formed inside the bank a (349a) and the bank b (349b). Further, the protective electrode 352 and the second passivation film 353 are formed thereon. Of course, as described in the above, the structure of the EL element may be reversed and the pixel electrode may be the cathode.

In this embodiment, the protective electrode 352 also functions as a wiring common in a pixel column, and is electrically connected to the FPC 611 via the connection wiring 612. Further, all elements included in the pixel portion 602 and the gate side driver circuit 603 are covered with the second passivation film 353. Though the second passivation film 353 may be omitted, it is preferable to provide it so that the respective elements are shielded from the external.

The covering material 1101 is adhered by a sealing material 1104. It is to be noted that spacers of a resin film may be provided to secure the space between the covering material 1101 and a light-emitting element. It is to be noted that the inside 1103 of the sealing material 1104 is a sealed space filled with an inert gas such as nitrogen or argon. Further, it is also effective to provide a hygroscopic agent represented by barium oxide inside the sealed space 1103.

Further, it is also possible to provide a filler in the space 1103. As the filler, PVC (polyvinyl chloride), an epoxy resin, a silicon resin, PVB (polyvinyl butyral), or EVA (ethylene vinyl acetate) can be used.

In this embodiment, as the covering material 1101, glass, plastic, or ceramics can be used.

As the sealing material 1104, though a photo-curable resin is preferably used, if the heat resistance of the EL layer permits, a thermosetting resin may also be used. It is to be noted that the sealing material 1104 is preferably a material that transmits moisture and oxygen as less as possible. Further, a hygroscopic agent may be added and placed inside the sealing material 1104.

By encapsulating the EL element using the above method, the EL element can be completely shielded from the external, and substances such as moisture and oxygen which invite deterioration of the EL layer due to oxidation can be prevented from entering. Accordingly, an EL display device with high reliability can be manufactured. It is to be noted that, though a case where the three kinds of stripe-like EL layers that emit red, green, and blue light, respectively, are formed in a longitudinal direction is described in this embodiment, they may be formed in a lateral direction.

It is to be noted that the structure of this embodiment can be freely combined with the structures of Embodiments 1 to 3.

Embodiment 5

When an active matrix type EL display device is placed as illustrated in FIG. 11A, pixel columns may be formed in a longitudinal direction so as to be stripe-like, or, may be formed into a delta arrangement.

Here, a case where red, green, and blue pixels are formed so as to be stripe-like on a substrate is described. It is to be noted that the number of colors of the pixels is not necessarily required to be three, and may be one or two. Further, the colors are not limited to these red, green, and blue, and other colors such as yellow, orange, and gray may also be used.

It is to be noted that the positional relationship between the substrate, a sample boat containing an EL material therein, and a mask for controlling the EL material in a vapor state is as illustrated in FIG. 1A.

First, an EL material for a red EL layer contained in the sample boat is vaporized, and the EL material in a vapor state is discharged from the sample boat. Here, since predetermined voltage is applied to the mask, the discharged EL material in a vapor state is controlled by an electric field when it reaches the mask, passes through the mask, and reach a desired location at the pixel portion. In this way, deposition at a desired location in the pixel portion can be controlled. The voltage applied to the mask is equal to or more than several 10 V and equal to or less than 10 kV.

First, the red EL material is deposited through evaporation. Since voltage is applied to the mask, the EL material can be selectively deposited at a desired location in the pixel portion.

Figure 12A:
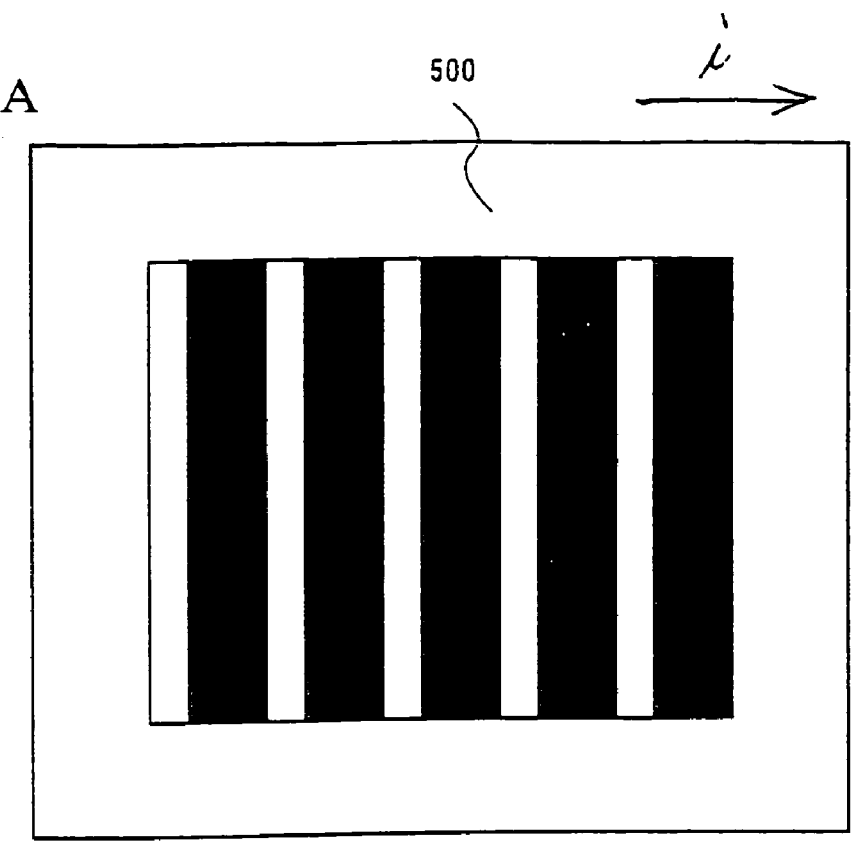
FIGS. 12A and 12B are diagrams each showing a pattern of deposition of an organic EL material by evaporation.

As the mask for forming a stripe-like EL layer in a pixel portion 704 (see FIG. 13A), a mask 500 for stripes illustrated in FIG. 12A may be used. It is to be noted that, as the mask, a mask which can form pixels into a delta arrangement may also be used.

In this embodiment, first, the red EL material is deposited through evaporation using the mask 500 for stripes illustrated in FIG. 12A. Then, after the mask 500 for stripes is moved in a lateral direction of an arrow i by one pixel column, a green EL material is deposited. After that, the mask 500 is further moved in the lateral direction of the arrow i by one pixel column, and then, a blue EL material is deposited. In this way, stripe-like red, green, and blue EL layers are formed in the pixel portion.

Figure 13A:
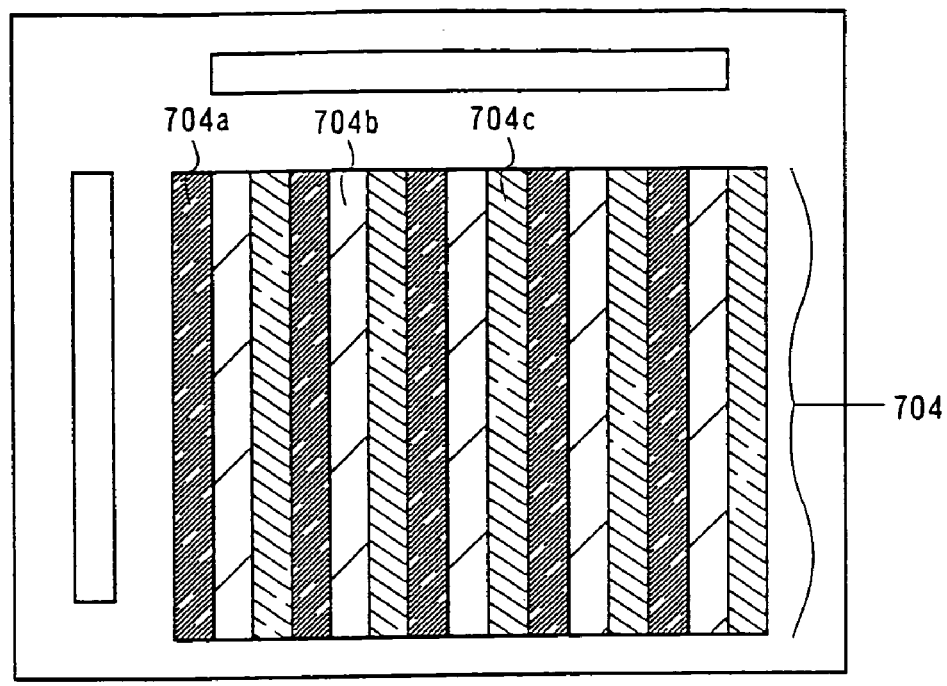
FIGS. 13A and 13B are diagrams each showing a pattern of a mask.
Figure 13B:
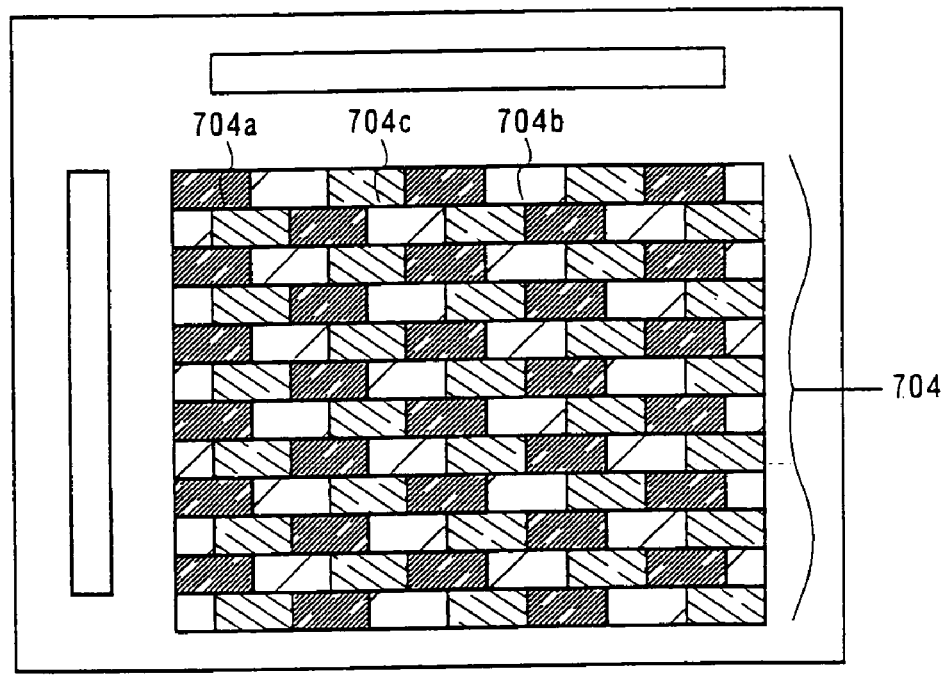

It is to be noted that, by forming the red, green, and blue EL materials in the pixel portion using the mask, stripe-like pixels can be formed in the pixel portion as illustrated in FIG. 13A.

Figure 12B:
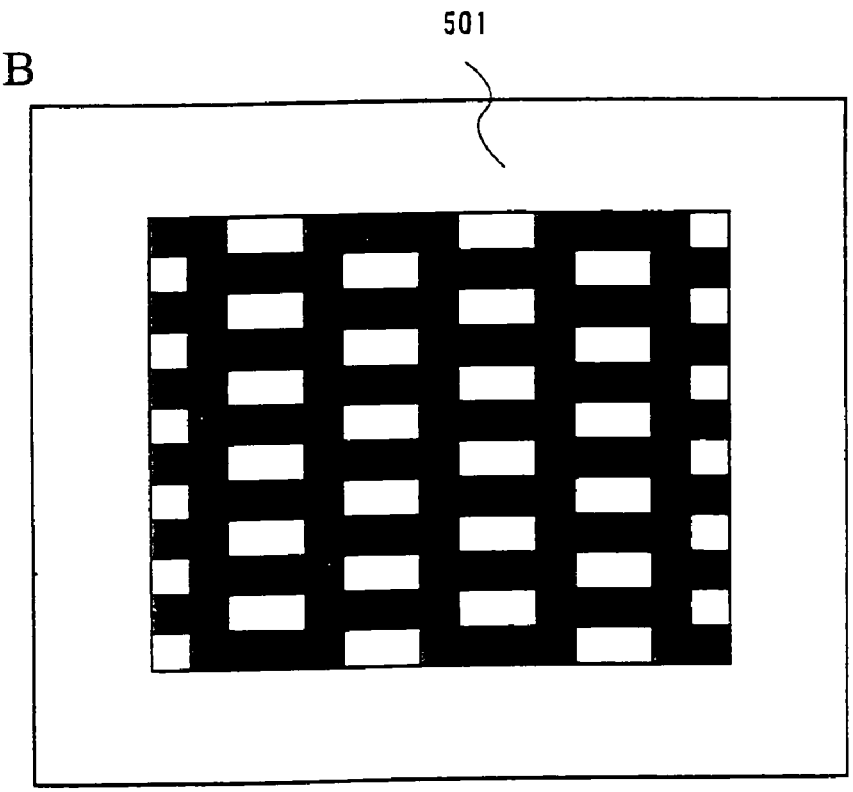

The mask 500 for stripes illustrated in FIG. 12A may be used as a mask for forming stripe-like EL layers in the pixel portion 704, while a mask 501 for a delta arrangement illustrated in FIG. 12B may be used as a mask for forming pixels into a delta arrangement.

In FIG. 13A, an EL layer 704a emitting red light, an EL layer 704b emitting green light, and an EL layer 704c emitting blue light are formed. It is to be noted that banks (not shown) are formed over source wirings through an insulating film in a longitudinal direction along the source wiring so as to be stripe-like.

The EL layer herein refers to a layer of an organic EL material that contributes to light emission such as an EL layer, a charge injection layer, or a charge transmission layer. There may be a case where the EL layer is a single EL layer. On the other hand, when a hole injection layer an EL layer are laminated, for example, the laminated films as a whole is referred to as an EL layer.

Here, it is desirable that a mutual distance (D) of adjacent pixels of the same color in a line is five or more times (preferably ten or more times) as large as the film thickness (t) of the EL layer. This is because, if $D<5t$, there is a possibility that a problem of crosstalk is caused between pixels. It is to be noted that, since an image with high definition can not be obtained if the distance (D) is too large, it is preferable that the relationship of $5t<D<50t$ (preferably $10t<D<35t$) is satisfied.

Further, the EL layer may be formed such that stripe-like banks are formed in a lateral direction and EL layers emitting red, green, and blue light may be formed in the lateral direction respectively. Here, the banks (not shown) are formed over gate wirings through an insulating film along the gate wiring.

In this case, also, it is desirable that a mutual distance (D) of adjacent pixels of the same color in a line is five or more times (preferably ten or more times) as large as the film thickness (t) of the EL layer. More preferably, the relationship of $5t<D<50t$ (preferably $10t<D<35t$) is satisfied.

As in this embodiment, by electrically controlling an EL material in a vapor state when an EL layer is formed by evaporation, the location of deposition can be controlled.

It is to be noted that the structure of this embodiment can be freely combined with the structures of Embodiments 1 to 4.

Embodiment 6

Figure 14:
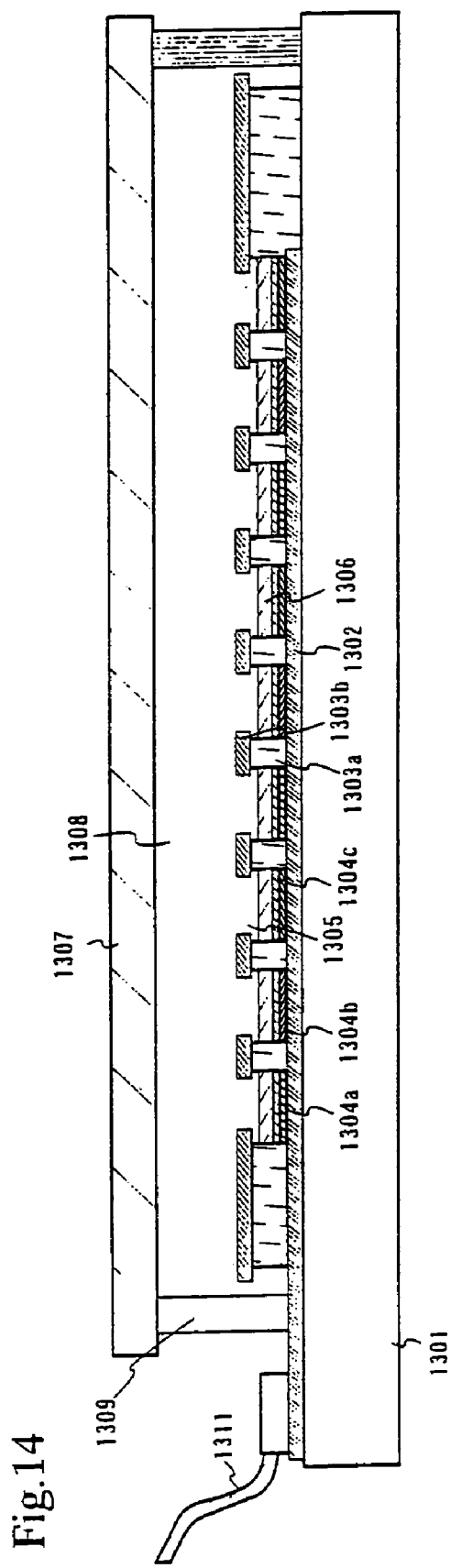
FIG. 14 is a diagram illustrating the structure in section of a passive EL display device.

A case of using the present invention in a passive type (simple matrix type) EL display device is explained in Embodiment 6. FIG. 14 is used in the explanation. In FIG. 14, reference numeral 1301 denotes a substrate made of plastic, and 1302 denotes an anode made of a transparent conductive film. In Embodiment 6, as the transparent conductive film, a compound of indium oxide and zinc oxide is formed by an evaporation method. Note that, although not shown in FIG. 14, a plurality of anodes are arranged in a stripe shape, in a parallel direction with a defined space.

Further, banks made of a bank a (1303a) and a bank b (1303b) are formed so as to fill up the space between the cathodes 1305 arranged in the stripe shape in a perpendicular direction to the defined space.

Subsequently, EL layers 1304a to 1304c made of an EL material are formed by the evaporation method shown in FIG. 1. Note that reference numeral 1304a is an EL layer emitting red color, 1304b is an EL layer emitting green color, and 1304c is a light emitting layer emitting blue color. The organic EL material used may be similar to that used in Embodiment 1. The EL layers are formed along grooves, which are formed by the bank a (1303a) and bank b (1303b), and therefore are arranged in a stripe shape, in a perpendicular direction to the defined space.

Note that, in Embodiment 6, the position where an EL material is coated on an anode is controlled by using a mask, and it may further be controlled by applying a voltage to an anode.

Next, although not shown by FIG. 14, a plurality of cathodes and a plurality of protective electrodes which have longitudinal directions in a perpendicular direction with the defined space, are arranged in a stripe shape orthogonal to the anodes 1302. Note that the cathodes 1305 are made of MgAg, and that the protective electrodes 1306 are aluminum alloy films in Embodiment 6, and both are formed by the evaporation method. Further, although not shown in the figure, a wiring is extended to a portion in which an FPC is later attached so as to apply a predetermined voltage to the protective electrodes 1306.

Further, after forming the protective electrodes 1306, not shown in the figure, a silicon nitride film may be formed here as a passivation film.

An EL element is thus formed on the substrate 1301. Note that the lower side electrodes are transparent anodes in Embodiment 6, and therefore light emitted from the EL layers 1304a to 1304c is emitted to the lower surface (the substrate 1301). However, the EL element structure can be inverted and the lower electrodes can be made into light shielding cathodes. In that case, light emitted from the EL layers 1304a to 1304c is irradiated to an upper surface (an opposite side to the substrate 1301).

Next, a ceramic substrate is prepared as a covering material 1307. A ceramic substrate is used because the covering material may be light shielding with the structure of this embodiment, but of course a substrate made from plastic or glass may also be used for a case of inverted EL element structure stated above since the covering material should be transparent.

After thus preparing the covering material 1307, it is joined with a sealing material 1309 made of an ultraviolet hardening resin. It is to be noted that the inside 1308 of the sealing material 1309 is a sealed space filled with an inert gas such as nitrogen or argon. Further, it is also effective to provide a hygroscopic agent represented by barium oxide in the sealed space 1308. Lastly, an anisotropic conducting film (FPC) 1311 is attached, and the passive type EL display device is completed.

Note that it is possible to implement the constitution of Embodiment 6 by freely combining it with the constitution of any of Embodiments 1 to 5.

Embodiment 7

When the present invention is implemented to manufacture an active matrix EL display device, it is effective to use a silicon substrate (silicon wafer) as a substrate. In the case of using the silicon substrate as the substrate, a manufacturing technique of MOSFET utilized in the conventional IC, LSI or the like can be employed to manufacture a switching element and a current control element to be formed in the pixel portion, or a driver element to be formed in the driver circuit portion.

The MOSFET can form circuits having extremely small variations as in its achievements in the IC and the LSI. Particularly, it is effective for the active matrix EL display device with an analog driver of performing gradation display by an electric current value.

It is to be noted that the silicon substrate is not transmissive, and therefore the structure needs to be constructed so that light from the EL layer is irradiated to a side opposite to the substrate. The structure of the EL display device of Embodiment 7 is similar to that of FIG. 14. However, the difference is that the MOSFET is used for forming a pixel portion 602 and a driver circuit portion 603 instead of a TFT.

Note that it is possible to implement the constitution of Embodiment 7 by freely combining it with the constitution of any of Embodiments 1 to 6.

Embodiment 8

An EL display device formed by implementing the present invention has superior visibility in bright locations in comparison to a liquid crystal display device because it is a self-emissive type device, and moreover its field of vision is wide. Accordingly, it can be used as a display portion for various electric apparatuses. For example, it is appropriate to use the EL display device of the present invention as a display portion of an EL display (a display incorporating the EL display device in its casing) having a diagonal equal to 30 inches or greater (typically equal to 40 inches or greater) for appreciation of TV broadcasts by large screen.

Note that all displays exhibiting (displaying) information such as a personal computer display, a TV broadcast reception display, or an advertisement display are included as the EL display. Further, the EL display device of the present invention can be used as a display portion of the other various electric apparatuses.

The following can be given as examples of such electric apparatuses: a video camera; a digital camera; a goggle type display (head mounted display); a car navigation system; an audio reproducing device (such as a car audio system, an audio compo system); a notebook personal computer; a game equipment; a portable information terminal (such as a mobile computer, a mobile telephone, a mobile game equipment or an electronic book); and an image playback device provided with a recording medium (specifically, a device which performs playback of a recording medium and is provided with a display which can display those images, such as a digital video disk (DVD)). In particular, because portable information terminals are often viewed from a diagonal direction, the wideness of the field of vision is regarded as very important. Thus, it is preferable that the EL display device is employed. Examples of these electric apparatuses are shown in FIGS. 15 to 16.

Figure 15A:
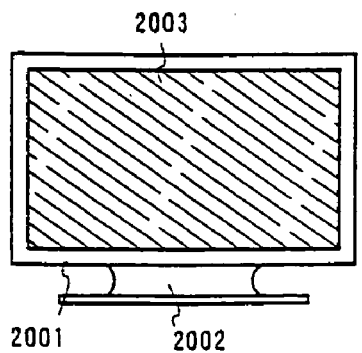
FIGS. 15A to 15F are diagrams showing specific examples of an electric apparatus.

FIG. 15A is an EL display, containing a casing 2001, a support stand 2002, and a display portion 2003. The present invention can be used in the display portion 2003. Since the EL display is a self-emissive type device without the need of a backlight, its display portion can be made thinner than a liquid crystal display device.

Figure 15B:
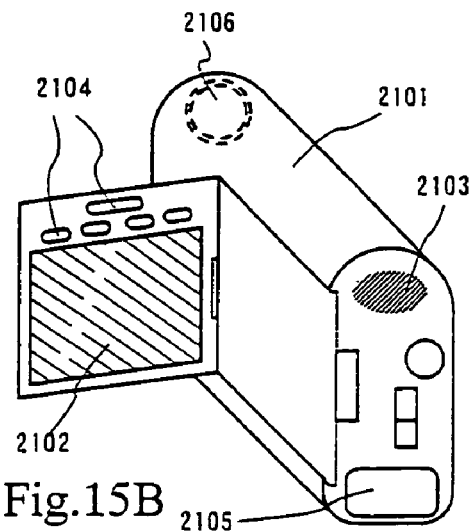

FIG. 15B is a video camera, containing a main body 2101, a display portion 2102, an audio input portion 2103, operation switches 2104, a battery 2105, and an image receiving portion 2106. The EL display device of the present invention can be used in the display portion 2102.

Figure 15C:
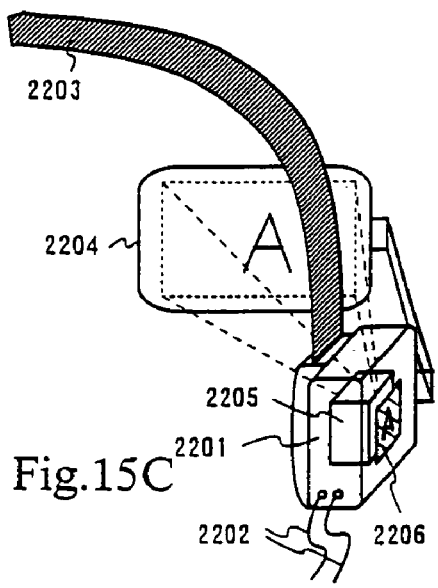

FIG. 15C is a portion of a head fitting type EL display (right side), containing a main body 2201, a signal cable 2202, a head fixing band 2203, a display portion 2204, an optical system 2205, and an EL display device 2206. The present invention can be used in the EL display device 2206.

Figure 15D:
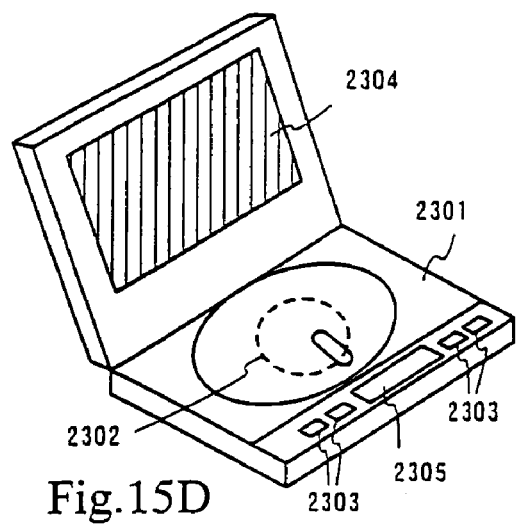

FIG. 15D is an image playback device (specifically, a DVD playback device) provided with a recording medium, containing a main body 2301, a recording medium (such as a DVD) 2302, operation switches 2303, a display portion (a) 2304, and a display portion (b) 2305. The display portion (a) is mainly used for displaying image information, and the image portion (b) is mainly used for displaying character information, and the EL display device of the present invention can be used in the image portion (a) and in the image portion (b). Note that domestic game equipment is included as the image playback device provided with a recording medium.

Figure 15E:
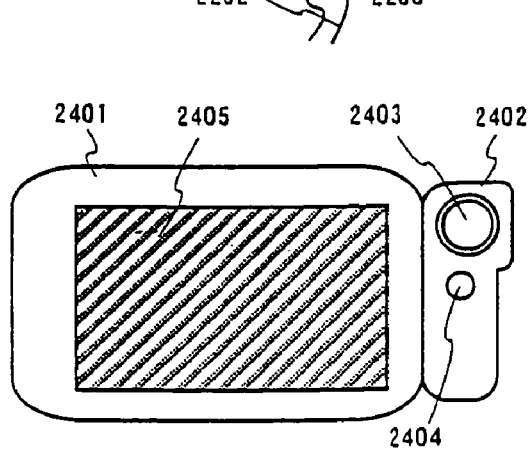

FIG. 15E is a mobile computer, containing a main body 2401, a camera portion 2402, an image receiving portion 2403, operation switches 2404, and a display portion 2405. The EL display device of the present invention can be used in the display portion 2405.

Figure 15F:
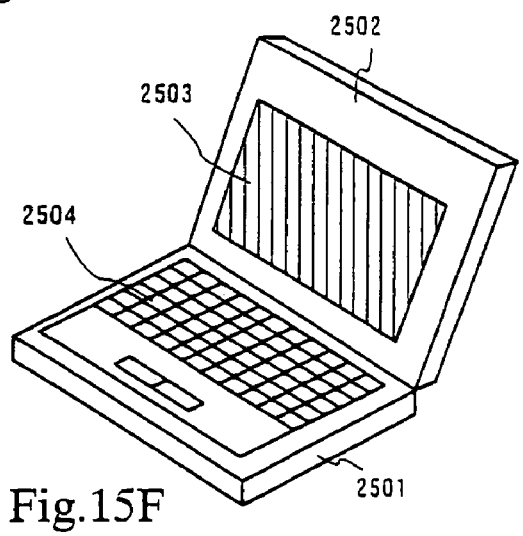

FIG. 15F is a personal computer, containing a main body 2501, a casing 2502, a display portion 2503, and a keyboard 2504. The EL display device of the present invention can be used in the display portion 2503.

Note that in the future if the emission luminance of organic EL materials becomes higher, the projection of light including outputted images can be enlarged by lenses or the like. Then it will become possible to use the EL display device of the present invention in a front type or a rear type projector.

The above electric apparatuses are becoming more often used to display information provided through a telecommunication path such as the Internet or CATV (cable television), and in particular, opportunities for displaying animation information are increasing. The response speed of organic EL materials is extremely high, and therefore the EL display device is favorable for performing animation display. However, the contours between pixels become hazy, whereby the entire animation also becomes hazy. Accordingly, it is extremely effective to use the EL display device of the present invention in the display portion of electric apparatuses because of its capability of clarifying the contours between pixels.

Further, the emitting portion of the EL display device consumes power, and therefore it is preferable to display information so as to have the emitting portion become as small as possible. Therefore, when using the EL display device in a display portion which mainly displays character information, such as a portable information terminal, in particular, a portable telephone and an audio reproducing device, it is preferable to drive it by setting non-emitting portions as background and forming character information in emitting portions.

Figure 16A:
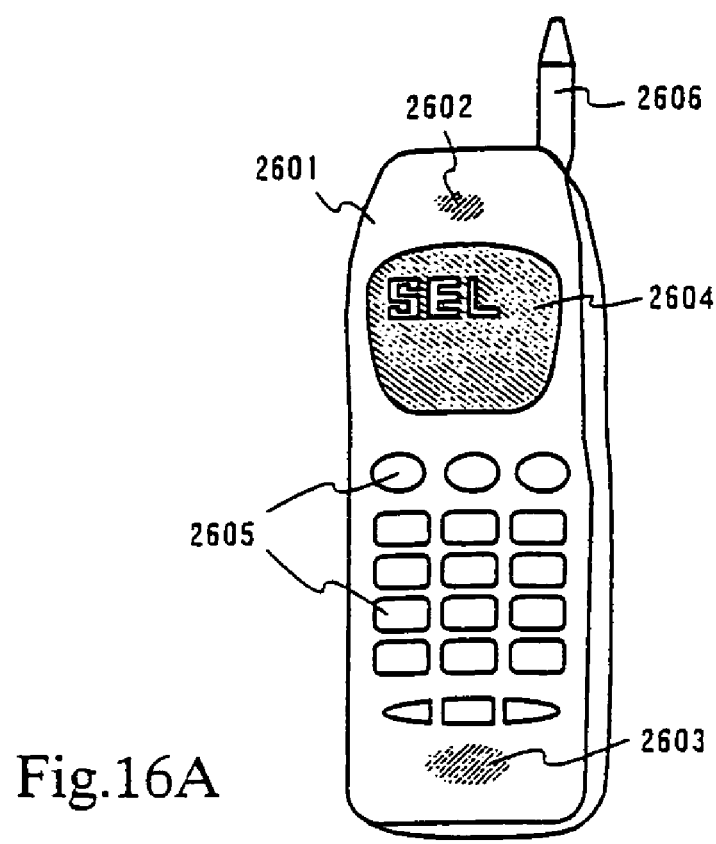
FIGS. 16A and 16B are diagrams showing specific examples of the electric apparatus.

FIG. 16A is a portable telephone, containing a main body 2601, an audio output portion 2602, an audio input portion 2603, a display portion 2604, operation switches 2605, and an antenna 2606. The EL display device of the present invention can be used in the display portion 2604. Note that by displaying character information in emitting portions in a black background in the display portion 2604, the power consumption of the portable telephone can be reduced.

Figure 16B:
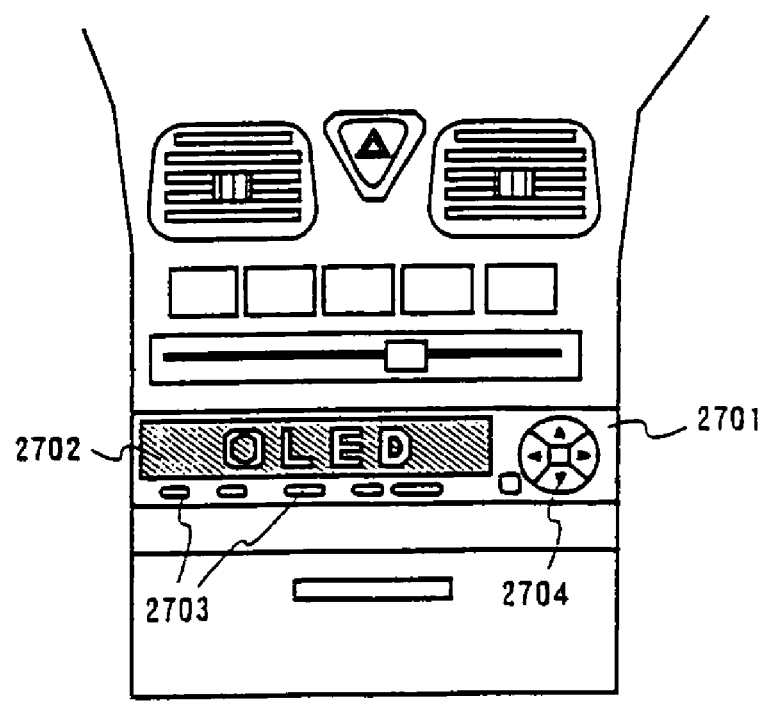

FIG. 16B is an audio reproducing device, specifically a car audio system, containing a main body 2701, a display portion 2702, and operation switches 2703 and 2704. The EL display device of the present invention can be used in the display portion 2702. Furthermore, an audio reproducing device for a car is shown in Embodiment 8, but it may also be used for a mobile type and a domestic type of audio reproducing device. Note that by displaying character information in emitting portions in a black background in the display portion 2704, the power consumption can be reduced. This is particularly effective in a mobile type audio reproducing device.

The range of applications of the present invention is thus extremely wide, and it is possible to apply the present invention to electric apparatuses in all fields. Furthermore, any constitution of the EL display device shown in Embodiments 1 to 7 may be employed in the electric apparatuses of Embodiment 8.

Embodiment 9

Described with reference to FIGS. 17A and 17B in this embodiment is a method of controlling an EL material vaporized in a sample boat (hereinafter referred to as an EL material in a vapor state) using an electric field around a plurality of masks and forming a film of the EL material on a substrate.

In FIG. 17, a reference numeral 1010 denotes a substrate. A sample boat 1011 has an EL material contained therein.

Further, the sample boat 1011, a first mask, and a second mask to be described here may be separately provided, or, alternatively, may be integrally formed as one device.

It is to be noted that, when a red EL layer is to be formed, the sample boat 1011 contains an EL material that emits red light (hereinafter referred to as a red EL material). When a green EL layer is to be formed, the sample boat 1011 contains an EL material that emits green light (hereinafter referred to as a green EL material). When a blue EL layer is to be formed, the sample boat 1011 contains an EL material that emits blue light (hereinafter referred to as a blue EL material).

It is to be noted that, in this embodiment, Alq as a host material with a red fluorescent pigment DCM doped therein is used as the red EL material for forming a red EL layer, Alq that is a complex of aluminum and 8-hydroxyquinoline is used as the green EL material for forming a green-light-emitting EL layer, and a complex of zinc and benzoxazole $(Zn(oxz)_2)$ is used as the blue EL material for forming a blue-light-emitting EL layer.

It is to be noted that the above EL materials are merely examples and other known EL materials may also be used. Further, though the EL materials are selected to emit red, green, and blue light, the present invention is not limited thereto and colors such as yellow, orange, and gray may also be used.

In this embodiment, first, the sample boat contains the red EL material. After a red EL layer is formed on the substrate, the sample boat now containing the green EL material is used to form a green EL layer on the substrate. Then, finally, the sample boat now containing the blue EL material is used to form a blue EL layer on the substrate.

As described in the above, by depositing through evaporation of the red, green, and blue EL materials in three installments, EL layers can be formed.

First, an EL material contained in the sample boat 1011 is vaporized by resistance heating using an electrode 1020. Just as the EL material in a vapor state is discharged from the sample boat 1011, under the influence of an electric field generated by the electrode 1012 attached at an opening of the sample boat 1011, the EL material in a vapor state is charged to be charged particles. The direction of progress of these charged particles is controlled when they pass through masks by an electric field around the masks generated by voltage applied to first blocking portions 1018 and second blocking portions 1019b.

It is to be noted that an electrode may be provided between the sample boat 1011 and the mask 1013 to control the charge of the EL material in a vapor state discharged from the sample boat 1011 by an electric field generated by the electrode.

As a result, the vapor EL material passes through spaces of the first and second blocking portions to be deposited on the surface of the substrate.

In the first mask 1013, the first blocking portions 1018 are a plurality of conductive wires arranged in parallel with one another (stripe-like) formed of a conductive material such as copper, iron, aluminum, tantalum, titanium, or tungsten, a mesh-like structure, or a plate-like structure. In a second mask 1019a, the second blocking portions 1019b are a plurality of conductive wires arranged in parallel with one another (stripe-like) formed of a conductive material such as copper, iron, aluminum, tantalum, titanium, or tungsten, a mesh-like structure, or a plate-like structure. The EL material in a vapor state repels an electric field generated by negative voltage applied to the first blocking portions 1018, and thus, passes through the gaps between the first blocking portions 1018. Further, the EL material in a vapor state repels an electric field generated by negative voltage applied to the second blocking portions 1019b, and thus, passes through the gaps between the second blocking portions 1019b to be deposited on the substrate.

Figure 17A:
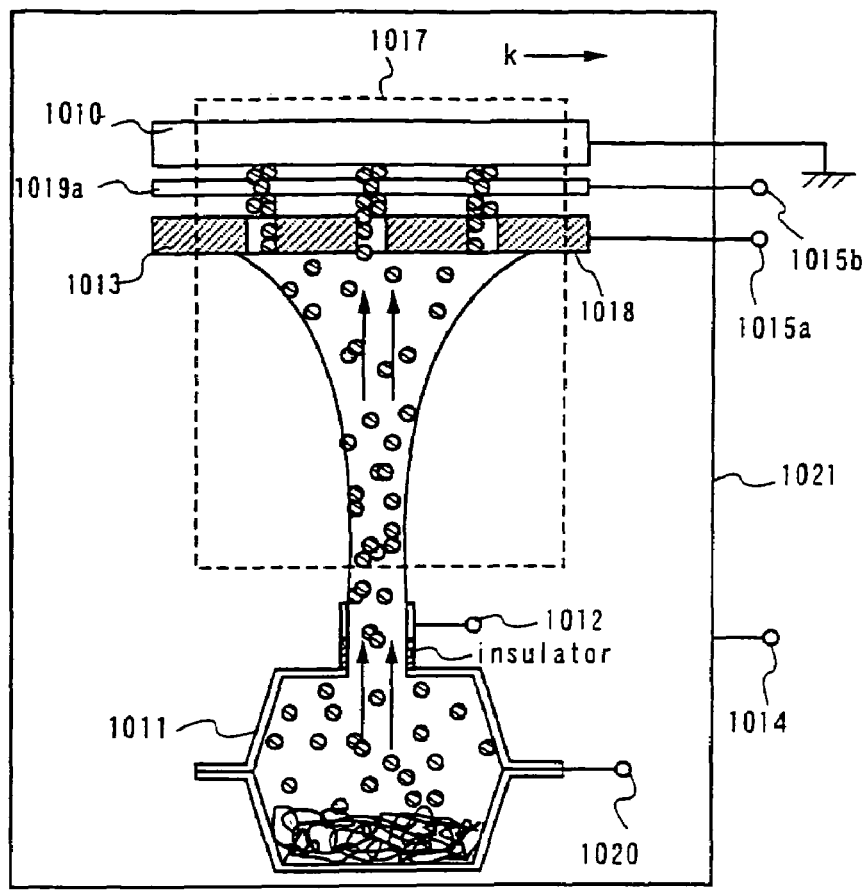
FIGS. 17A and 17B are diagrams illustrating a method of depositing an organic EL material by evaporation according to the present invention.
Figure 17B:
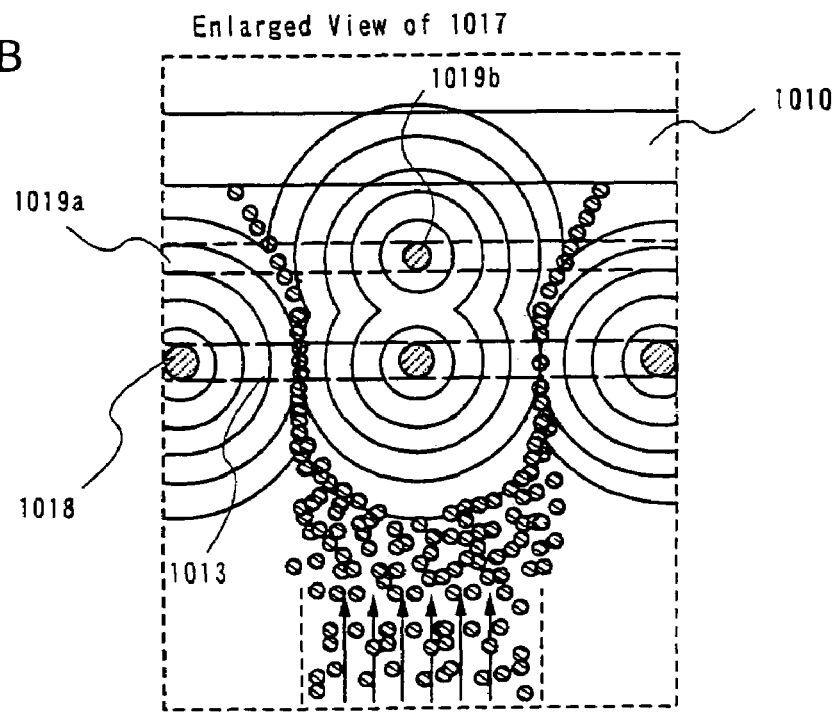

Though FIGS. 17A and 17B illustrate a case where the sections of the first blocking portion and of the second blocking portion are circular, the present invention is not limited thereto, and the sections may be rectangular, oval or polygonal.

It is to be noted that voltage for giving the EL material in a vapor state a potential which repels the first blocking portions 1018 of the first mask 1013 is applied to the first blocking portions 1018 of the first mask 1013. This allows the EL material to pass through the spaces between the first blocking portions 1018 of the first mask 1013. It is to be noted that, here, the EL material in a vapor state is charged by the electric field generated by the electrode 1012 to which negative voltage is applied, while negative voltage is applied by an electrode 1015a to the first blocking portions 1018 of the first mask 1013 to generate an electric field. Further, negative voltage is applied by an electrode 1015b to the second blocking portions 1019b of the second mask 1019a to generate an electric field. These make the charged particles of the EL material in a vapor state electrically repel the first and second blocking portions to pass through gaps of the first and second blocking portions.

By making a structure as illustrated in FIG. 17A and by appropriately controlling the negative first voltage applied to the first blocking portions 1018 and the negative second voltage applied to the second blocking portions 1019b in the range of several equal to or more than 10 V and equal to or less than 10 kV, the location of deposition can be controlled with high accuracy.

It is to be noted that the distance between the first mask 1013 and the second mask 1019a, the distance between the second mask 1019a and the substrate, the distance between the first blocking portions 1018, the distance between the second blocking portions 1019b, and the like can be appropriately set by those who implement the present invention. For example, the distance between the first blocking portions 1018 and the distance between the second blocking portions 1019b may be a pixel pitch of the pixel electrode formed over the substrate.

Further, openings in the masks refer to gaps between the first or second blocking portions.

Further, a surface where an EL material is to be formed herein refers to a part of the surface of a pixel electrode or an organic film where a thin film is to be formed.

Further, by applying negative voltage by an electrode 1014 to inner side surfaces of an evaporation chamber 1021 which has therein the sample boat 1011, the first and second masks, and the substrate 1010, the negatively charged EL material in a vapor state can be made to repel the inner side surfaces of the evaporation chamber, and therefore, the EL material in a vapor state can be deposited without adhering to the inner side surfaces of the evaporation chamber.

By depositing the red EL material in the sample boat 1011 by evaporation, a stripe-like red EL layer is formed on pixels. Here, the mask is moved in a direction of an arrow k by one pixel column, and in a similar way, a green EL material is deposited by evaporation from the sample boat 1011 to form a green EL layer next to the red EL layer. The mask is further moved in the direction of the arrow k by one pixel column and the blue EL material is deposited by evaporation from the sample boat 1011 to form a blue EL layer next to the green EL layer. In other words, by depositing in three installments pixel columns emitting red, green, and blue light, respectively, as the mask is moved in the direction of the arrow k, stripe-like EL layers of three colors are formed. It is to be noted that the thickness of the EL layers formed here is preferably 100 nm to 1 μm.

It is to be noted that the sample boat 1011 having the EL material contained therein may be changed every time when the kind of EL material is changed, or, alternatively, only the EL material to be used may be changed without changing the sample boat 1011.

It is to be noted that a pixel column as used herein refers to a column of pixels formed by being partitioned by banks (not shown) that are formed over source wirings. Therefore, a pixel column may also be represented as a plurality of pixels lined up along a source wiring. Though a case where the banks are formed over the source wirings is described here, the banks may be formed over gate wirings. In that case, a plurality of pixels lined up along a gate wiring is referred to as a pixel column.

Therefore, a pixel portion (not shown) may be regarded as an aggregate of a plurality of pixel columns partitioned by stripe-like banks provided over a plurality of source wirings or a plurality of gate wirings. The pixel portion may also be regarded as constitution of pixel columns having stripe-like EL layers emitting red light formed thereon, pixel columns having stripe-like EL layers emitting green light formed thereon, and pixel columns having stripe-like EL layers emitting blue light formed thereon.

Since the stripe-like banks are provided over the plurality of source wirings or the plurality of gate wirings, practically, the pixel portion may also be regarded as an aggregate of a plurality of pixel columns partitioned by the plurality of source wirings or the plurality of gate wirings.

Further, it is preferable to apply voltage to a pixel electrode (an anode) formed on the substrate 1010 to generate an electric field that further controls the EL material in a vapor state having passed through the first and second masks and selectively deposits the EL material in a vapor state at desired locations.

Further, in order to accurately position the first mask 1013 and the second mask 1019*a*, the first mask 1013 and the second mask 1019*a* may be formed by laminating two conductive plates and cutting them simultaneously by an electron discharge method to form slit-like or circular holes.

It is to be noted that the structure of this embodiment can be freely combined with the structures of Embodiments 1 to 8.

Embodiment 10

According to the present invention, it is also possible to use an EL material that can use phosphorescence from triplet exciton for light emission (also referred to as a triplet compound). A self-light-emitting device using an EL material that can use phosphorescence for light emission can drastically improve the external light emission quantum efficiency. This makes it possible to lower the power consumption, prolong the life, and lighten the weight, of the EL element.

The following papers report that the external light emission quantum efficiency is improved using triplet exciton.

The structural formula of an EL material (coumarin pigment) reported by T. Tsutsui, C. Adachi, and S. Saito in Photochemical Processes in Organized Molecular Systems, ed. K. Honda (Elsevier Sci. Pub., Tokyo, 1991), p. 437 is as follows:

(Chemical Formula 1)

The structural formula of an EL material (Pt complex) reported by M. A. Baldo, D. F. O'Brien, Y. You, A. Shoustikov, S. Sibley, M. E. Thompson, and S. R. Forrest in Nature 395 (1998), p. 151 is as follows:

(Chemical Formula 2)

The structural formula of an EL material (Ir complex) reported by M. A. Baldo, S. Lamansky, P. E. Burrows, M. E. Thompson, and S. R. Forrest in Appl. Phys. Lett., 75 (1999), p. 4, and by T. Tsutsui, M. J. Yang, M. Yahiro, K. Nakamura, T. Watanabe, T. Tsuji, Y. Fukuda, T. Wakimoto, and S. Mayaguchi in Jpn. Appl. Phys., 38 (12B) (1999) L1502 is as follows:

(Chemical Formula 3)

If the above phosphorescence from triplet exciton can be used, in principle, external light emission quantum efficiency that is three to four times as much as that when fluorescence from singlet exciton is used can be realized.

It is to be noted that the structure of this embodiment can be freely combined with any structures of Embodiments 1 to 9.

According to the present invention, when a film of an EL material is formed by evaporation through a mask on a surface where it is to be formed, a situation in which the EL material can not pass through the mask and is deposited on the mask can be avoided. Further, according to the present invention, the accuracy of positioning the location of film formation can be improved by using a plurality of masks.

Further, since the EL material is prevented from being deposited on the mask by electric repellence, the mask can be used many times. Further, a film of the EL material can be formed with accuracy without a problem of inaccurate positioning. Therefore, the manufacturing yield of an EL display device using the EL material can be improved and the cost can be lowered. Further, since a location of deposition of the EL material in a vapor state is controlled just before the deposition, a conventional deposition method can be used, and the present invention can be applied widely.

What is claimed is:

1. A light emitting device comprising:
   a first bank including an inorganic material formed on a first electrode;
   a second bank including an organic material formed over the first bank;
   a layer including a light-emitting organic material in contact with the first bank; and
   a second electrode in contact with the first bank over the layer,
   wherein a thickness of the first bank is larger than a thickness by laminating the layer and the second electrode, and
   wherein a side face of the layer and a side face of the second electrode are aligned against a side face of the first bank.

2. The light emitting device according to claim 1, wherein the inorganic material is silicon oxide or silicon nitride.

3. The light emitting device according to claim 1, wherein the organic material is a polyimide resin, a polyamide resin, or a photosensitive resin.

4. The light emitting device according to claim 1, wherein the first bank and the second bank are stripe-like banks.

5. The light emitting device according to claim 1, wherein the layer including a light-emitting organic material is in contact with a side surface of the first bank and is not in contact with the second bank.

6. The light emitting device according to claim 1, wherein a width of the first bank is smaller than a width of the second bank.

7. The light emitting device according to claim 1, wherein the first bank includes a dye.

8. A light emitting device comprising:
a first bank including an organic material formed on a first electrode;
a second bank including an inorganic material formed over the first bank;
a layer including a light-emitting organic material in contact with the first bank; and
a second electrode in contact with the first bank over the layer,
wherein a thickness of the first bank is larger than a thickness by laminating the layer and the second electrode, and
wherein a side face of the layer and a side face of the second electrode are aligned against a side face of the first bank.

9. The light emitting device according to claim 8, wherein the inorganic material is silicon oxide or silicon nitride.

10. The light emitting device according to claim 8, wherein the organic material is a polyimide resin, a polyamide resin, or a photosensitive resin.

11. The light emitting device according to claim 8, wherein the first bank and the second bank are stripe-like banks.

12. The light emitting device according to claim 8, wherein the layer including a light-emitting organic material is in contact with a side surface of the first bank and is not in contact with the second bank.

13. The light emitting device according to claim 8, wherein a width of the first bank is smaller than a width of the second bank.

14. The light emitting device according to claim 8, wherein the first bank includes a dye.

15. A light emitting device comprising:
a first bank including an organic material formed on a first electrode;
a second bank including an organic material formed over the first bank;
a layer including a light-emitting organic material in contact with the first bank; and
a second electrode in contact with the first bank over the layer,
wherein a thickness of the first bank is larger than a thickness by laminating the layer and the second electrode, and
wherein a side face of the layer and a side face of the second electrode are aligned against a side face of the first bank.

16. The light emitting device according to claim 15, wherein the organic material in the first bank is a polyimide resin, a polyamide resin, or a photosensitive resin.

17. The light emitting device according to claim 15, wherein the organic material in the second bank is a polyimide resin, a polyamide resin, or a photosensitive resin.

18. The light emitting device according to claim 15, wherein the first bank and the second bank are stripe-like banks.

19. The light emitting device according to claim 15, wherein the layer including a light-emitting organic material is in contact with a side surface of the first bank and is not in contact with the second bank.

20. The light emitting device according to claim 15, wherein a width of the first bank is smaller than a width of the second bank.

21. The light emitting device according to claim 15, wherein the first bank includes a dye.

22. A light emitting device comprising:
at least two banks, each including a first bank and a second bank over the first bank;
a layer including a light-emitting organic material between the two banks, wherein the layer is in contact with the first banks; and
an electrode over the layer in contact with the first banks,
wherein the first bank includes an inorganic material,
wherein the second bank includes an organic material,
wherein a thickness of the first bank is larger than a thickness by laminating the layer and the electrode, and
wherein a side face of the layer and a side face of the second electrode are aligned against a side face of the first bank.

23. The light emitting device according to claim 22, wherein the inorganic material is silicon oxide or silicon nitride.

24. The light emitting device according to claim 22, wherein the organic material is a polyimide resin, a polyamide resin, or a photosensitive resin.

25. The light emitting device according to claim 22, wherein the first bank and the second bank are stripe-like banks.

26. The light emitting device according to claim 22, wherein the layer including a light-emitting organic material is in contact with a side surface of the first bank and is not in contact with the second bank.

27. The light emitting device according to claim 22, wherein a width of the first bank is smaller than a width of the second bank.

28. The light emitting device according to claim 22, wherein the first bank includes a dye.

29. A light emitting device comprising:
at least two banks, each including a first bank and a second bank over the first bank;
a layer including a light-emitting organic material between the two banks, wherein the layer is in contact with the first banks; and
an electrode over the layer in contact with the first banks,
wherein the first bank includes an organic material,
wherein the second bank includes an inorganic material,
wherein a thickness of the first bank is larger than a thickness by laminating the layer and the electrode, and
wherein a side face of the layer and a side face of the second electrode are aligned against a side face of the first bank.

30. The light emitting device according to claim 29, wherein the inorganic material is silicon oxide or silicon nitride.

31. The light emitting device according to claim 29, wherein the organic material is a polyimide resin, a polyamide resin, or a photosensitive resin.

32. The light emitting device according to claim 29, wherein the first bank and the second bank are stripe-like banks.

33. The light emitting device according to claim 29, wherein the layer including a light-emitting organic material is in contact with a side surface of the first bank and is not in contact with the second bank.

34. The light emitting device according to claim 29, wherein a width of the first bank is smaller than a width of the second bank.

35. The light emitting device according to claim 29, wherein the first bank includes a dye.

36. A light emitting device comprising:
- at least two banks, each including a first bank and a second bank over the first bank;
- a layer including a light-emitting organic material between the two banks, wherein the layer is in contact with the first banks; and
- an electrode over the layer in contact with the first banks,
- wherein the first bank includes an organic material,
- wherein the second bank includes an organic material,
- wherein a thickness of the first bank is larger than a thickness by laminating the layer and the electrode, and
- wherein a side face of the layer and a side face of the second electrode are aligned against a side face of the first bank.

37. The light emitting device according to claim 36, wherein the organic material in the first bank is a polyimide resin, a polyamide resin, or a photosensitive resin.

38. The light emitting device according to claim 36, wherein the organic material in the second bank is a polyimide resin, a polyamide resin, or a photosensitive resin.

39. The light emitting device according to claim 36, wherein the first bank and the second bank are stripe-like banks.

40. The light emitting device according to claim 36, wherein the layer including a light-emitting organic material is in contact with a side surface of the first bank and is not in contact with the second bank.

41. The light emitting device according to claim 36, wherein a width of the first bank is smaller than a width of the second bank.

42. The light emitting device according to claim 36, wherein the first bank includes a dye.

43. A light emitting device comprising:
- a first bank including an inorganic material formed on a first electrode;
- a second bank including an organic material formed over the first bank;
- a layer including a light-emitting organic material in contact with the first bank; and
- a second electrode over the layer,
- wherein a thickness of the first bank is larger than a thickness by laminating the layer and the second electrode, and
- wherein a side face of the layer and a side face of the second electrode are in contact with a side face of the first bank.

* * * * *